US011818854B2

(12) United States Patent
Zhong et al.

(10) Patent No.: US 11,818,854 B2
(45) Date of Patent: Nov. 14, 2023

(54) ELECTRONIC MODULE AND ELECTRONIC APPARATUS

(71) Applicant: Wistron Corporation, New Taipei (TW)

(72) Inventors: Yong-Qing Zhong, New Taipei (TW); Yisheng Chen, New Taipei (TW); Zhao-Ping Fu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/397,997

(22) Filed: Aug. 10, 2021

(65) Prior Publication Data

US 2022/0418133 A1    Dec. 29, 2022

(30) Foreign Application Priority Data

Jun. 28, 2021    (CN) .......................... 202110720761.4

(51) Int. Cl.
*H05K 5/02* (2006.01)
*H05K 5/03* (2006.01)

(52) U.S. Cl.
CPC .......... *H05K 5/0256* (2013.01); *H05K 5/023* (2013.01); *H05K 5/0221* (2013.01); *H05K 5/03* (2013.01)

(58) Field of Classification Search
CPC ....................................................... H05K 5/00
See application file for complete search history.

(56) References Cited

U.S. PATENT DOCUMENTS

2019/0394896 A1* 12/2019 Wu ...................... G11B 33/123

* cited by examiner

*Primary Examiner* — Jerry Wu
(74) *Attorney, Agent, or Firm* — JCIPRNET

(57) ABSTRACT

An electronic module adapted to an electronic apparatus is provided. The electronic apparatus includes a casing and an electronic assembly, and the electronic assembly is disposed on the casing. The electronic module includes at least one electronic component, a carrier, a rotation component, a connection component, and an elastic assembly. The carrier carries the electronic component, and the carrier is arranged on the casing. The rotation component is pivotally connected to the carrier. The connection component is connected pivotally to the rotation component. The elastic assembly is disposed on the connection component and a hook portion is disposed thereon. The hook portion is adapted to be hooked to the casing, such that the electronic component is plugged to the electronic assembly by the elastic assembly.

17 Claims, 22 Drawing Sheets

ELECTRONIC MODULE AND ELECTRONIC APPARATUS

CROSS-REFERENCE TO RELATED APPLICATION

This application claims the priority benefit of China application serial no. 202110720761.4, filed on Jun. 28, 2021. The entirety of the above-mentioned patent application is hereby incorporated by reference herein and made a part of this specification.

BACKGROUND

Technical Field

The disclosure relates to an electronic module and an electronic apparatus, and particularly relates to an electronic module and an electronic apparatus having removable electronic components.

Description of Related Art

Most servers are equipped with backup batteries to provide power when the main power supply fails. When a backup battery has a certain weight (more than 0.6 kg, for example) and volume, it takes more effort to disassemble and assemble it. In addition, the backup battery is generally directly plugged to a connector of the main board of a server, and the connection may be unreliable due to manufacturing and assembly tolerances or external forces. Furthermore, when the server is equipped with multiple backup batteries, the user often needs to remove and replace the backup batteries one by one, which is a rather laborious task.

SUMMARY

The disclosure is directed to an electronic module, which is easy to be assembled and disassembled and may be reliably plugged to an electronic assembly in an electronic apparatus.

The disclosure is directed to an electronic apparatus, in which an electronic module is easy to be assembled and disassembled and may be reliably plugged to an electronic assembly in the electronic apparatus.

The disclosure provides an electronic module adapted to an electronic apparatus. The electronic apparatus includes a casing and an electronic assembly, and the electronic assembly is disposed on the casing. The electronic module includes at least one electronic component, a carrier, a rotation component, a connection component and an elastic assembly. The carrier carries the electronic component, and the carrier is arranged on the casing. The rotation component is connected pivotally to the carrier. The connection component is pivotally connected pivotally to the rotation component. The elastic assembly is disposed on the connection component and is configured with a hook portion. The hook portion is adapted to be hooked to the casing, such that the electronic component is plugged to the electronic assembly by the elastic assembly.

In an embodiment of the disclosure, the casing is configured with a hook groove, the rotation component is adapted to be rotated toward the hook groove in a first rotation direction to a first state so that the hook portion is aligned with the hook groove, and the rotation component is adapted to be rotated in a second rotation direction opposite to the first rotation direction to a second state so that the hook portion aligned with the hook groove is hooked to the hook groove, wherein when the hook portion is hooked to the hook groove and the rotation component is rotated to a third state in the second rotation direction, the electronic module is moved to the electronic assembly through the elastic assembly so that the at least one electronic component is plugged to the electronic assembly, and an elastic force of the elastic assembly prevents the at least one electronic component from being separated from the electronic assembly.

In an embodiment of the disclosure, a pivot end of the connection component is pivotally connected to the rotation component, and when the hook portion is hooked to the hook groove and the rotation component is rotated to the third state in the second rotation direction, the electronic module is moved by a first distance along a plugging direction so that the at least one electronic component is plugged to the electronic assembly, and the pivot end is moved by a second distance relative to the carrier in a direction opposite to the plugging direction, wherein the first distance is equal to the second distance.

In an embodiment of the disclosure, the casing is configured with a buckling component, and when the rotation component is in the third state, the buckling component positions the rotation component.

In an embodiment of the disclosure, the casing is configured with a first guide portion, and when the rotation component is rotated in the first rotation direction to the first state to move the hook portion out of the hook groove, the rotation component is pushed against the first guide portion to drive the electronic module to move in a direction away from the electronic assembly.

In an embodiment of the disclosure, the connection component has a pivot end and a free end opposite to each other, the pivot end is connected pivotally to the rotation component, and the elastic assembly is arranged at the free end, wherein the elastic assembly comprises an elastic component and a hook, one end of the hook is configured with the hook portion and extends from a free end of the connection component, and the elastic component is limited between another end of the hook and the free end of the connection component.

In an embodiment of the disclosure, a pivot axial direction of the connection component and the rotation component is parallel to a pivot axial direction of the rotation component and the carrier.

The disclosure provides an electronic apparatus including a casing, an electronic assembly and an electronic module. The electronic assembly is disposed on the casing. The electronic module includes at least one electronic component, a carrier, a rotation component, a connection component and an elastic assembly. The carrier carries the electronic component, and the carrier is arranged on the casing. The rotation component is connected pivotally to the carrier. The connection component is connected pivotally to the rotation component. The elastic assembly is disposed on the connection component and is configured with a hook portion. The hook portion is hooked to the casing, such that the electronic component is plugged to the electronic assembly by the elastic assembly.

In an embodiment of the disclosure, the casing is configured with a hook groove, the rotation component is adapted to be rotated toward the hook groove in a first rotation direction to a first state so that the hook portion is aligned with the hook groove, and the rotation component is adapted to be rotated in a second rotation direction opposite to the first rotation direction to a second state so that the hook portion aligned with the hook groove is hooked to the hook groove, wherein when the hook portion is hooked to the hook groove and the rotation component is rotated to a third state in the second rotation direction, the electronic module is moved to the electronic assembly through the elastic assembly so that the at least one electronic component is plugged to the electronic assembly.

In an embodiment of the disclosure, a pivot end of the connection component is pivotally connected to the rotation component, and when the hook portion is hooked to the hook groove and the rotation component is rotated to the third state in the second rotation direction, the electronic module is moved by a first distance along a plugging direction so that the at least one electronic component is plugged to the electronic assembly, and the pivot end is moved by a second distance relative to the carrier in a direction opposite to the plugging direction, wherein the first distance is equal to the second distance.

In an embodiment of the disclosure, the casing is configured with a buckling component, and when the rotation component is in the third state, the buckling component positions the rotation component.

In an embodiment of the disclosure, the casing is configured with a first guide portion, and when the rotation component is rotated in the first rotation direction to the first state to move the hook portion out of the hook groove, the rotation component is pushed against the first guide portion to drive the electronic module to move in a direction away from the electronic assembly.

In an embodiment of the disclosure, the connection component has a pivot end and a free end opposite to each other, the pivot end is connected pivotally to the rotation component, and the elastic assembly is arranged at the free end, wherein the elastic assembly comprises an elastic component and a hook, one end of the hook is configured with the hook portion and extends from a free end of the connection component, and the elastic component is limited between another end of the hook and the free end of the connection component.

In an embodiment of the disclosure, a pivot axial direction of the connection component and the rotation component is parallel to a pivot axial direction of the rotation component and the carrier.

In an embodiment of the disclosure, the casing is configured with a first coupling portion, and the electronic apparatus comprises: a cover body, pivotally connected to the casing and adapted to cover the electronic module, wherein the cover body is configured with a second coupling portion; wherein when the cover body covers the electronic module, the first coupling portion and the second coupling portion are buckled to position the cover body.

In an embodiment of the disclosure, the casing comprises a sliding component slidably disposed on the casing and adjacent to the first coupling portion, and when the cover body covers the electronic module, the sliding component and the first coupling portion of the casing position the second coupling portion of the cover body.

In an embodiment of the disclosure, the sliding component is configured with a guide portion, and when the cover body covers the electronic module, the second coupling portion of the cover body is positioned between the guide portion of the sliding component and the first coupling portion of the casing.

In an embodiment of the disclosure, a length of the guide portion of the sliding component in one direction is greater than a length of the first coupling portion.

In an embodiment of the disclosure, the cover body is configured with at least one elastic arm, and when the cover body covers the electronic module, the at least one elastic arm leans against the electronic module.

Based on the above description, in the electronic module of the disclosure, the carrier used for carrying the electronic component is configured with the rotation component for the user to operate, and the rotation component and the elastic assembly may be linked through the connection component. Accordingly, the user may operate the rotation component to make the hook portion of the elastic assembly to be hooked with or separated from the casing of the electronic apparatus, so as to conveniently disassemble and assemble the electronic module. Moreover, through an elastic force of the elastic assembly, the electronic component in the electronic module may be reliably plugged to the electronic assembly of the electronic apparatus.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
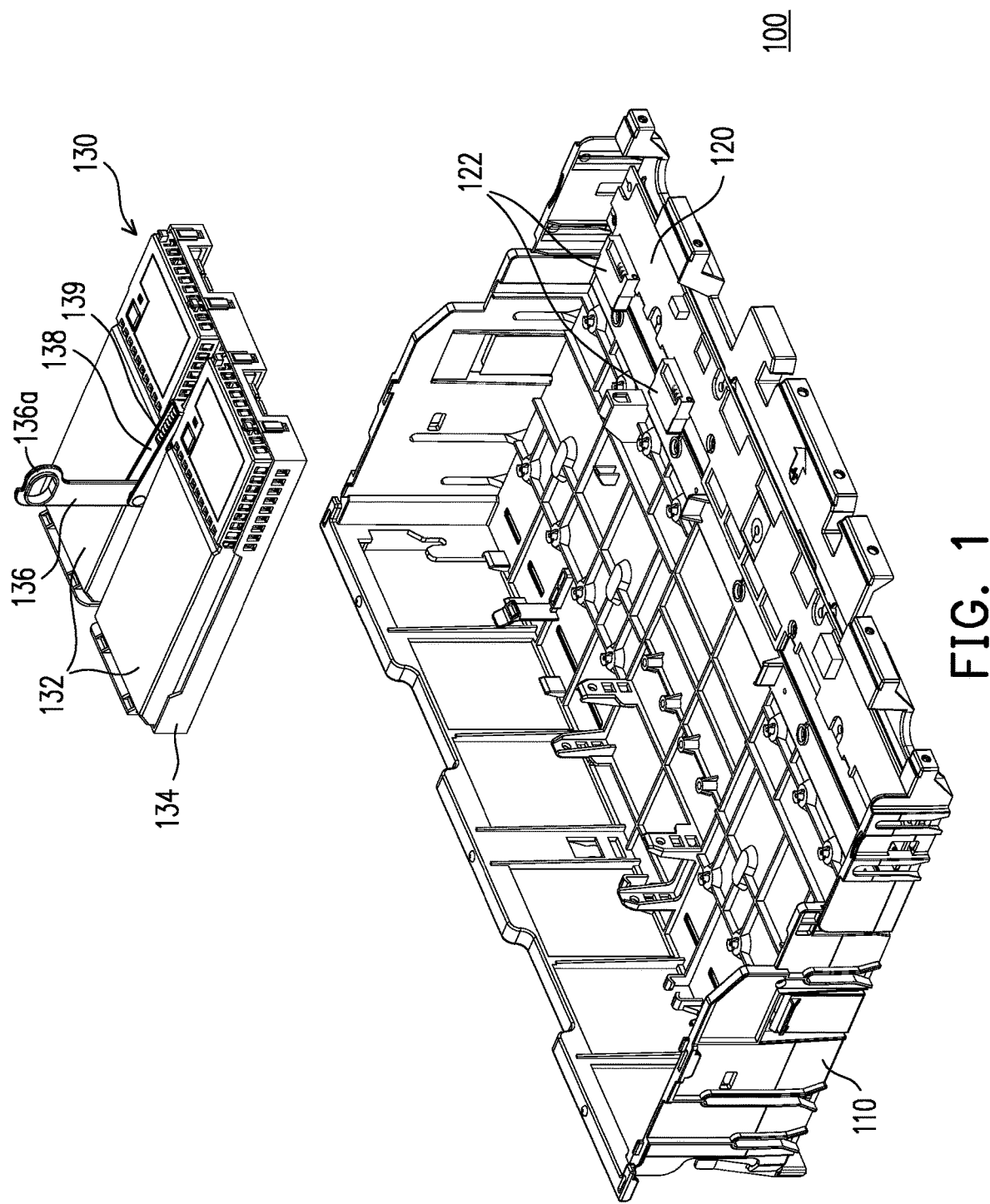
FIG. 1 is an exploded view of a part of components of an electronic apparatus according to an embodiment of the disclosure.
Figure 2:
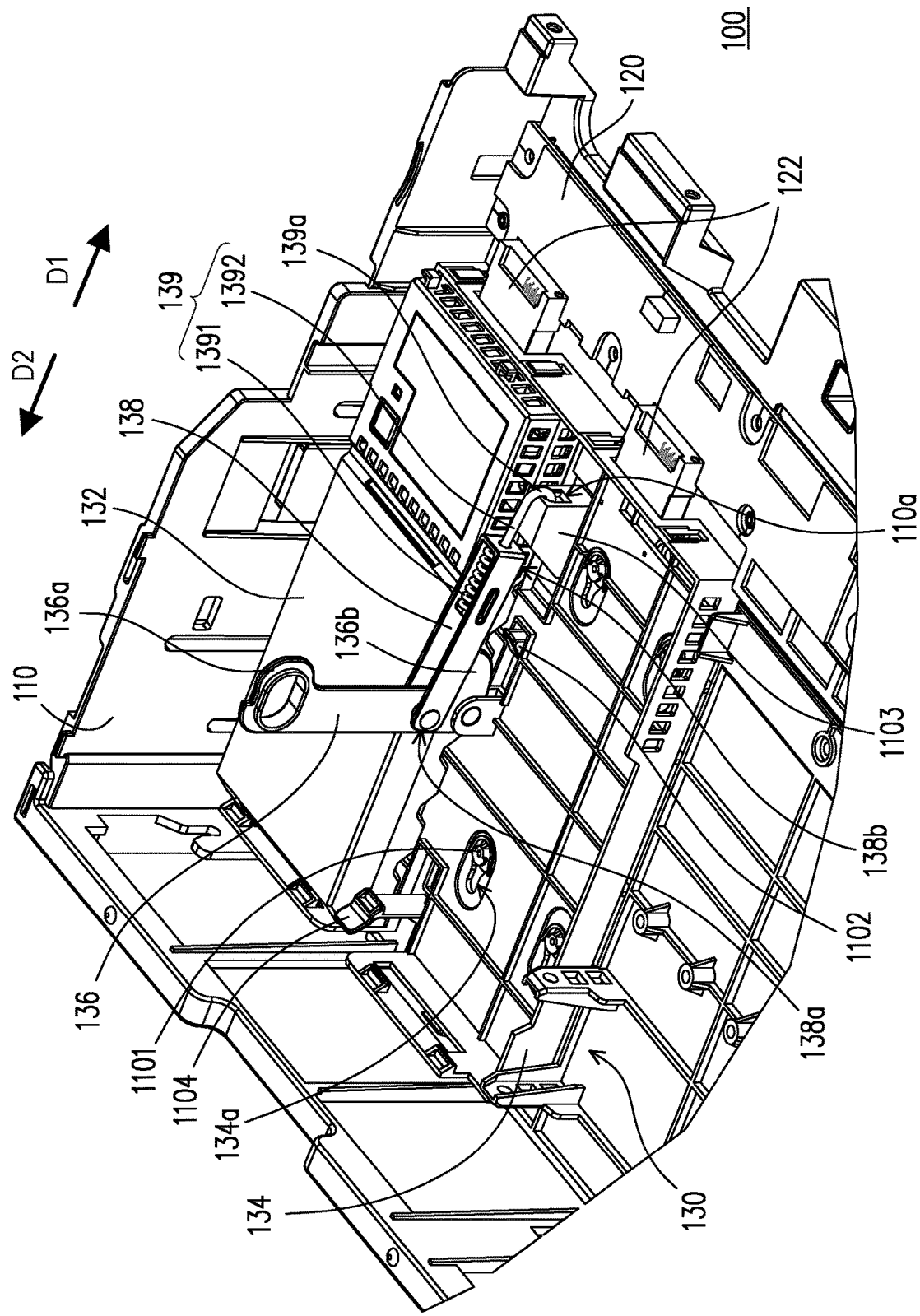
FIG. 2 is a three-dimensional view of a part of components of the electronic apparatus of FIG. 1.
Figure 3:
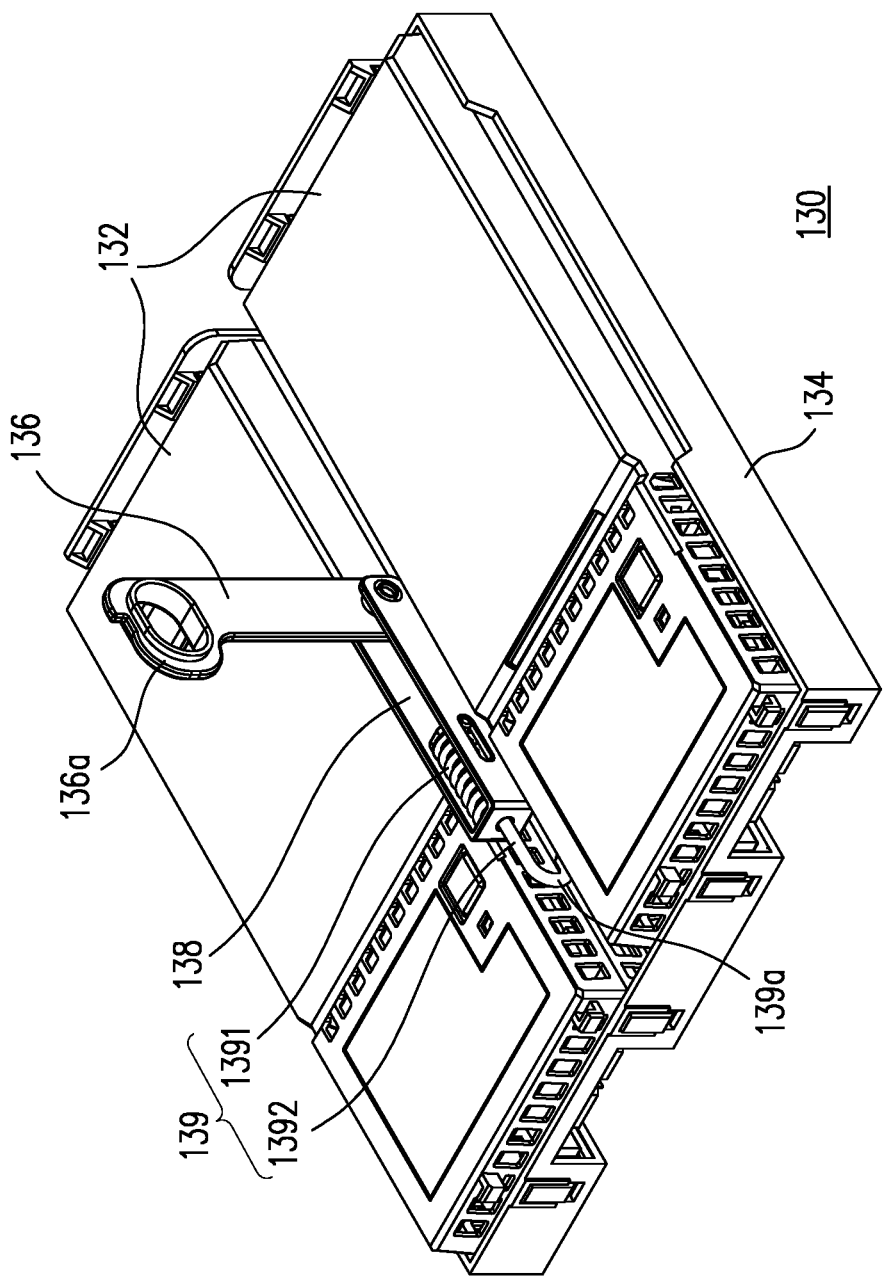
FIG. 3 is a three-dimensional view of an electronic module of FIG. 1.

FIG. 1 is an exploded view of a part of components of an electronic apparatus according to an embodiment of the disclosure. FIG. 2 is a three-dimensional view of a part of components of the electronic apparatus of FIG. 1. FIG. 3 is a three-dimensional view of an electronic module of FIG. 1. Referring to FIG. 1 to FIG. 3, an electronic apparatus 100 of the embodiment is, for example, a server and includes a casing 110, an electronic assembly 120 and an electronic module 130. The electronic assembly 120 is, for example, a motherboard of the server, which is disposed on the casing 110 and has connectors 122.

The electronic module 130 includes at least one electronic component 132 (two are shown), a carrier 134, a rotation component 136, a connection component 138, and an elastic assembly 139. The electronic component 132 is, for example, a backup battery of the server, the carrier 134 carries the electronic components 132, and the carrier 134 is adapted to be detachably mounted on the casing 110. The rotation component 136 is pivotally connected to the carrier 134, and the connection component 138 is pivotally connected to the rotation component 136. The elastic assembly 139 is disposed on the connection component 138. The casing 110 is configured with a hook groove 110a (shown in FIG. 2), and the hook groove 110a is located between the rotation component 136 and the electronic assembly 120 in a plugging direction D1. The elastic assembly 139 is configured with a hook portion 139a, and the hook portion 139a is hooked to the hook groove 110a of the casing 110, so that the electronic components 132 are moved along the plugging direction D1 by an elastic force of the elastic assembly 139 and plugged to the connectors 122 of the electronic assembly 120.

As described above, in the electronic module 130 of the embodiment, the carrier 134 used for carrying the electronic components 132 is configured with the rotation component 136 for the user to operate, and the rotation component 136 and the elastic assembly 139 may be linked through the connection component 138. In this way, the user may operate the rotation component 136 to make the hook portion 139a of the elastic assembly 139 to be hooked with or separate from the casing 110 of the electronic apparatus 100, so as to conveniently disassemble and assemble the electronic module 130. Moreover, through the elastic force of the elastic assembly 139, the electronic components 132 in the electronic module 130 may be reliably plugged to the electronic assembly 120 of the electronic apparatus 100.

Figure 4:
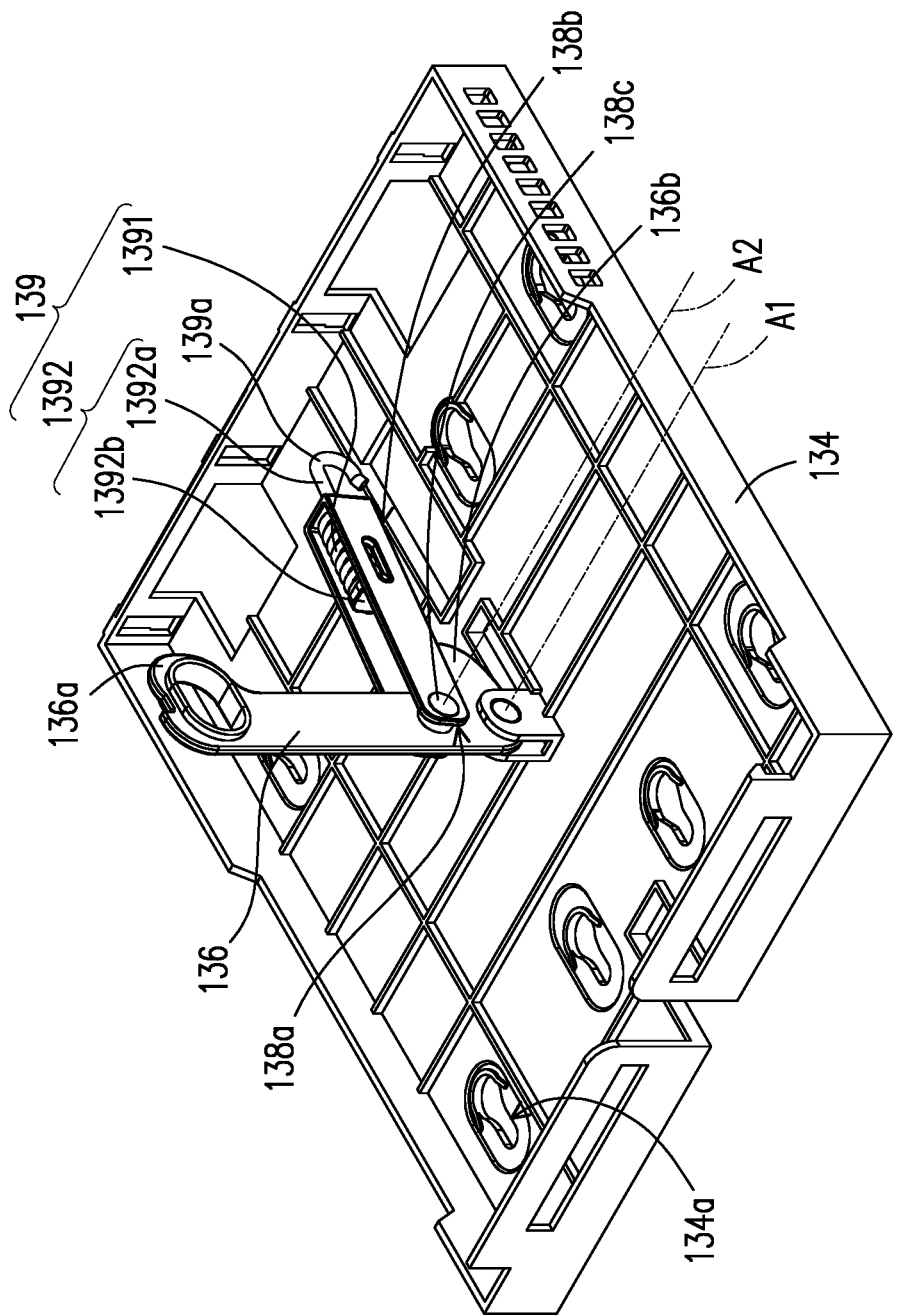
FIG. 4 is a three-dimensional view of a part of components of the electronic module of FIG. 3.
Figure 5:
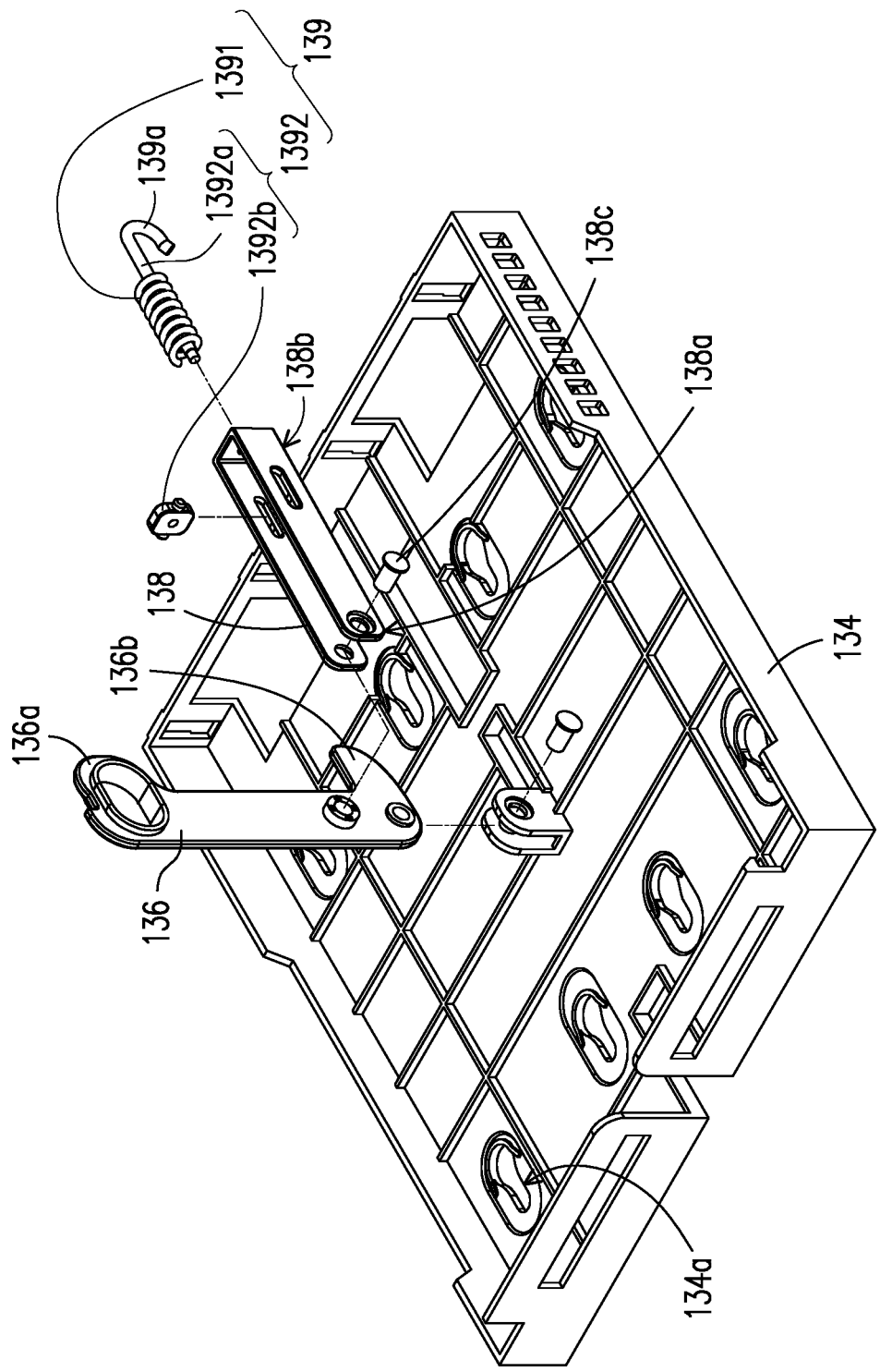
FIG. 5 is an exploded view of a part of components of the electronic module of FIG. 3.
Figure 6:
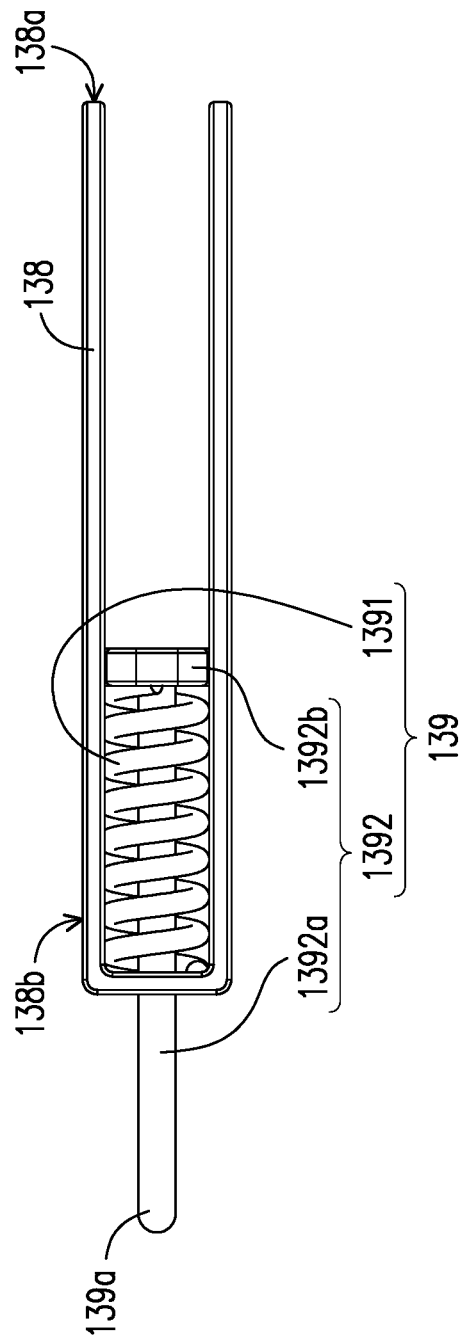
FIG. 6 is a side view of a connection component and an elastic assembly of FIG. 3.

FIG. 4 is a three-dimensional view of a part of components of the electronic module of FIG. 3. FIG. 5 is an exploded view of a part of components of the electronic module of FIG. 3. FIG. 6 is a side view of the connection component and the elastic assembly of FIG. 3. Referring to FIG. 4 to FIG. 6, the connection component 138 of the embodiment has a pivot end 138a and a free end 138b opposite to each other. The pivot end 138a is connected pivotally to the rotation component 136 by a pin 138c, and the elastic assembly 139 is configured at the free end 138b. In addition, a pivot axial direction A2 of the connection component 138 and the rotation component 136 is parallel to a pivot axial direction A1 of the rotation component 136 and the carrier 134.

In detail, the elastic assembly 139 includes an elastic component 1391 and a hook 1392. The hook 1392 includes a main body portion 1392a and a stop portion 1392b. One end of the main body portion 1392a of the hook 1392 has the aforementioned hook portion 139a and protrudes out from the free end 138b of the connection component 138. The stop portion 1392b is connected to the other end of the main body portion 1392a. The elastic component 1391 is, for example, a spring and it is limited between the stop portion 1392b at the other end of the hook 1392 and the free end 138b of the connection component 138.

Figure 7A:
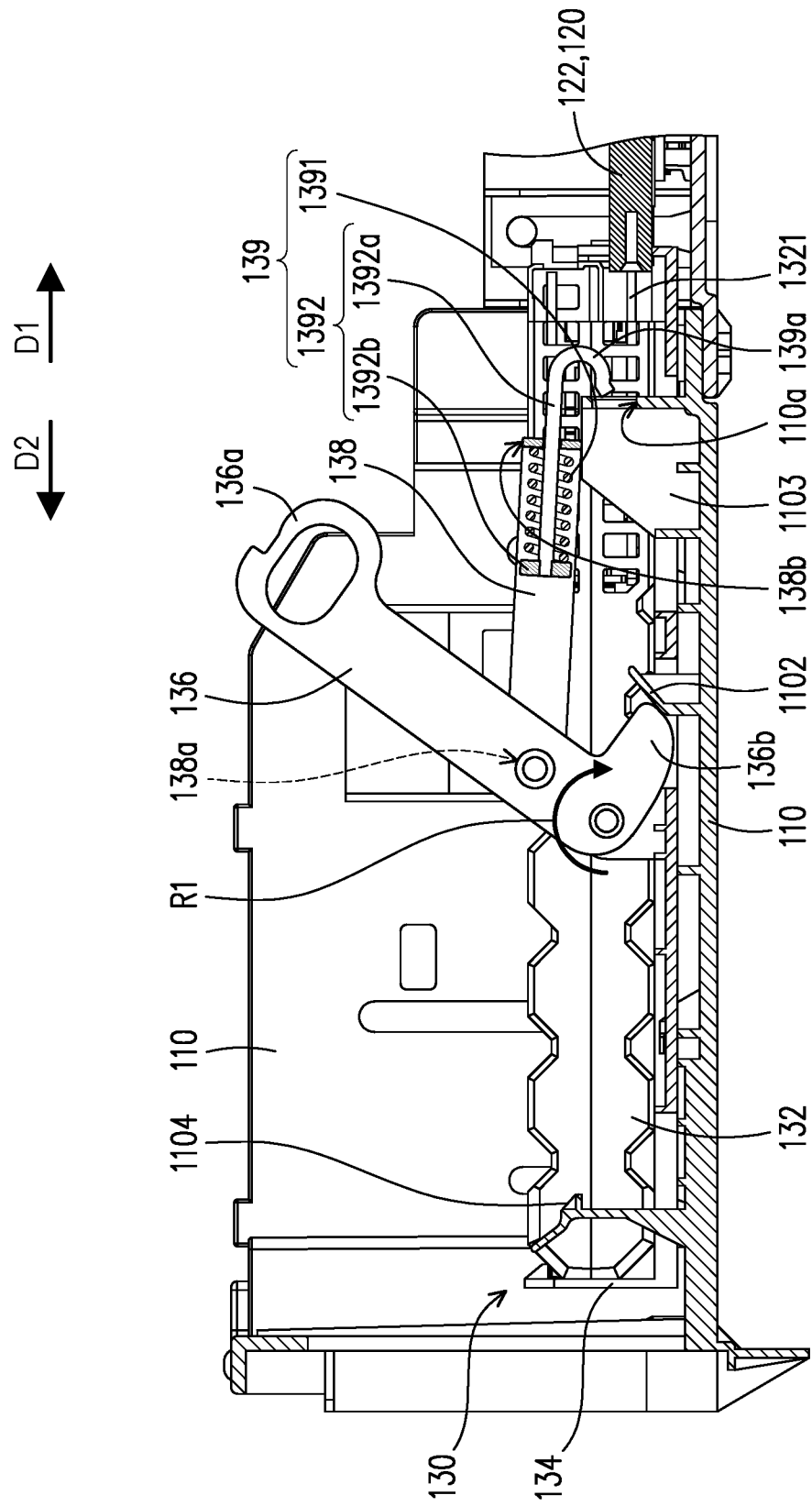
FIG. 7A to FIG. 7C are flowcharts of installing an electronic module of FIG. 2 to a casing.
Figure 7B:
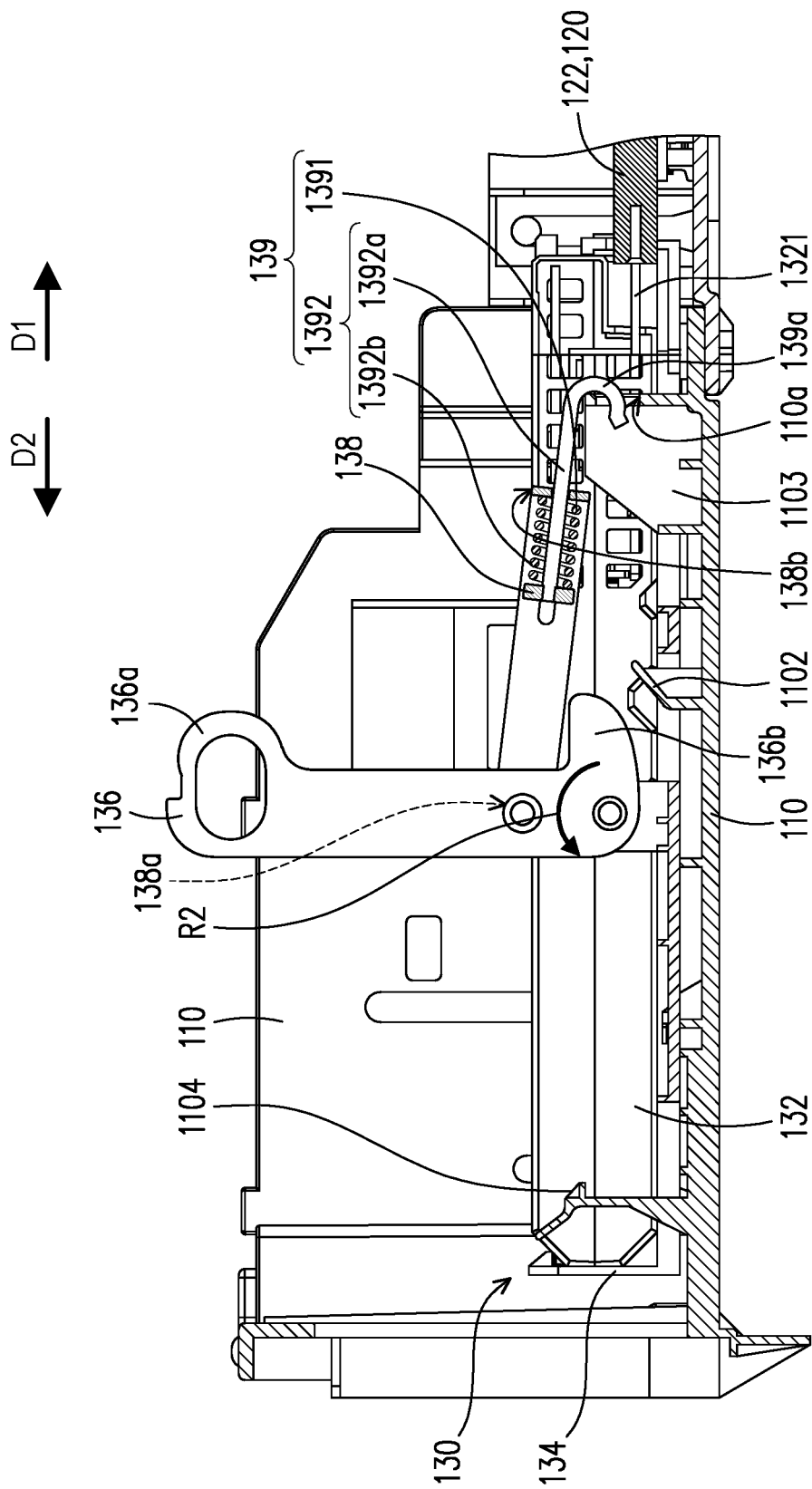
Figure 7C:
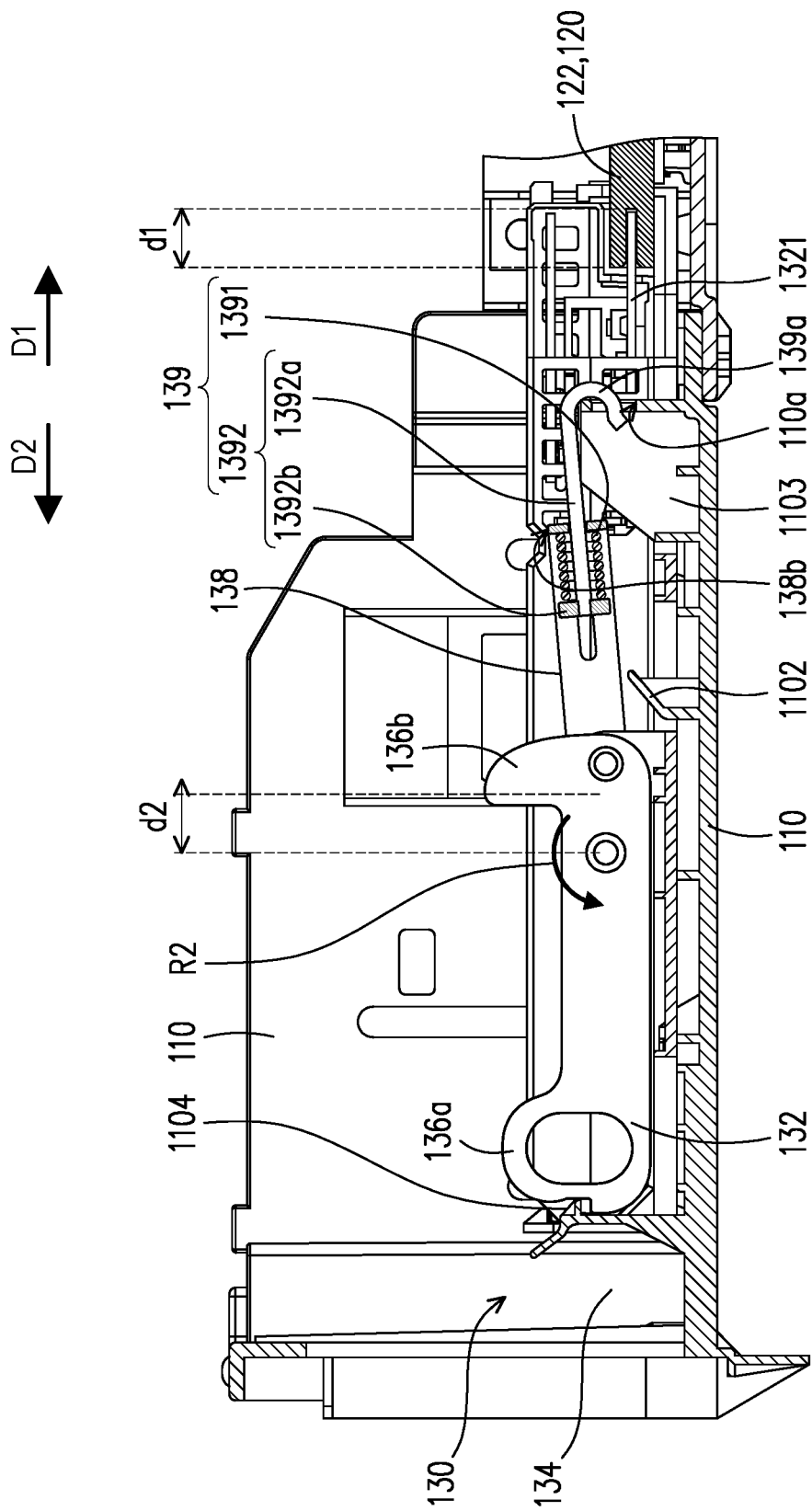

FIG. 7A to FIG. 7C are flowcharts of installing the electronic module of FIG. 2 to the casing. In the embodiment, the rotation component 136 is configured with a holding portion 136a and an abutting portion 136b, and the holding portion 136a and the abutting portion 136b extend in different directions from the pivot axial direction A1 of the connection component 138 and the rotation component 136. When the electronic module 130 is installed, a user may first lift the electronic module 130 through the holding portion 136a of the rotation component 136 and place the electronic module 130 in the casing 110, and make a plurality of gourd holes 134a of the carrier 134 to be corresponding to a plurality of positioning posts 1101 of the casing 110 to form a state shown in FIG. 2. Then, the user may apply a force to the rotation component 136 to rotate the rotation component 136 toward the hook groove 110a in a first rotation direction R1 (shown in FIG. 7A) to a first state shown in FIG. 7A so that the hook portion 139a is aligned with the hook groove 110a. Then, the user may apply a force to the rotation component 136 to rotate the rotation component 136 in a second rotation direction R2 (shown in FIG. 7B) opposite to the first rotation direction R1 to a second state shown in FIG. 7B so that the hook portion 139a aligned with the hook groove 110a is hooked to the hook groove 110a. During the process of operating the rotation component 136 from the first state shown in FIG. 7A to the second state shown in FIG. 7B, the hook portion 139a of the elastic assembly 139 drives the stop portion 1392b to move toward the free end 138b of the connection component 138 to compress the elastic component 1391, so that a distance between the pivot end 138a of the connection component 138 and the hook portion 139a of the elastic assembly 139 is gradually increased.

In the embodiment, as shown in FIG. 2, the casing 110 is configured with a first guide portion 1102, and the first guide portion 1102 is located between the rotation component 136 and the electronic assembly 120 in the plugging direction D1. When the rotation component 136 is rotated in the first rotation direction R1 to the first state shown in FIG. 7A as described above, the abutting portion 136a of the rotation component 136 contacts the first guide portion 1102, and the first guide portion 1102 guides the rotation component 136 to rotate to a predetermined angle, when the rotation component 136 is rotated in the second rotation direction R2 to the second state shown in FIG. 7B, the first guide portion 1102 guides the abutting portion 136b of the rotation component 136 to move away from the first guide portion 1102.

In addition, the casing 110 of the embodiment is further configured with a second guide portion 1103. The second guide portion 1103 is located between the first guide portion 1102 and the electronic assembly 120 in the plugging direction D1, the hook groove 110a is configured on the second guide portion 1103 at a side facing the electronic assembly 120, and the hook groove 110a is configure to hook with the hook portion 139a along a hooking direction D2. When the rotation component 136 is rotated in the first rotation direction R1 to the first state shown in FIG. 7A, the first guide portion 1102 guides the rotation component 136 to a predetermined angle, and the rotation component 136 drives the connection component 138 and the elastic assembly 139 to contact the second guide portion 1103. At this time, the hook portion 139*a* of the elastic assembly 139 is aligned with the hook groove 110*a* through guiding of the second guide portion 1103 to the connection component 138. When the hook portion 139*a* is hooked to the hook groove 110*a* as shown in FIG. 7B and the rotation component 136 is continuously rotated in the second rotation direction R2 to the third state shown in FIG. 7C, an amount of compression of the elastic component 1391 of the elastic assembly 139 is increased, and the electronic module 130 is moved toward the electronic assembly 120 by a first distance d1 in the plugging direction D1 opposite to the hooking direction D2 through the elastic force of the elastic component 1391 of the elastic assembly 139, such that a connecting end 1321 of the electronic component 132 is plugged to the connector 122 of the electronic assembly 120, and the elastic force of the elastic component 1391 of the elastic assembly 139 prevents the electronic component 132 from being separated from the connector 122 of the electronic assembly 120. Therefore, it is possible to prevent the electronic component 132 from being unable to be reliably plugged to the electronic assembly 120 due to manufacturing and assembly tolerances of the electronic apparatus 100, and prevent the electronic component 132 from being loosened from the electronic assembly 120 due to vibration. In the operation process of FIG. 7B to FIG. 7C, the pivot end 138*a* of the connection component 138 is moved by a second distance d2 relative to the carrier 134 in a direction opposite to the plugging direction D1 (the same as the hooking direction D2).

The aforementioned first distance d1 is equal to the aforementioned second distance d2, so that the electronic component 132 may be smoothly plugged to the electronic assembly 120 along with the operation of the electronic module 130. In addition, in the embodiment, the casing 110 is configured with a buckling component 1104, and when the rotation component 136 is in the third state as shown in FIG. 7C, the buckling component 1104 is buckled to a buckling portion 136*a*1 of the holding portion 136*a* of the rotation component 136.

Figure 8A:
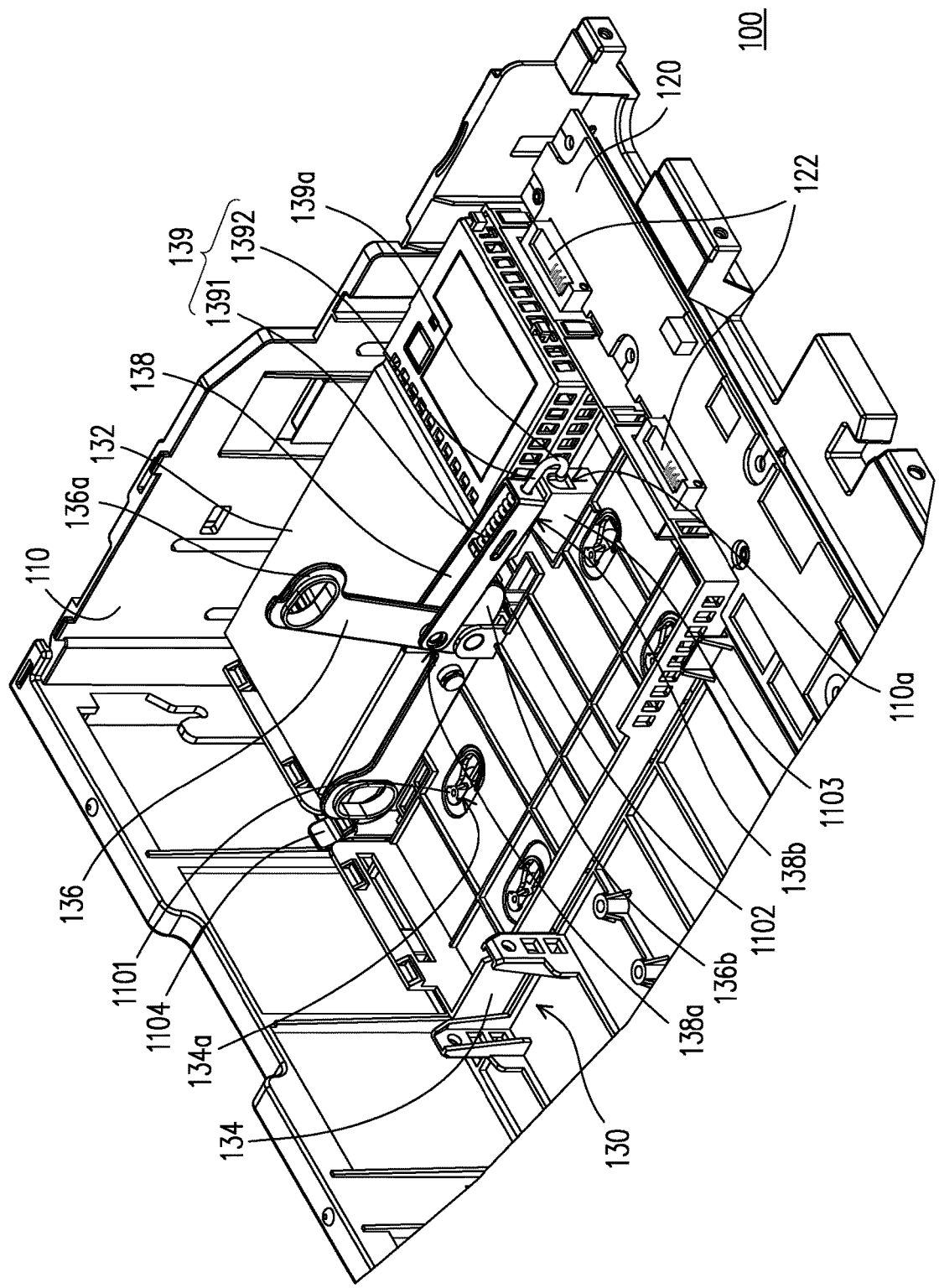
FIG. 8A to FIG. 8C are flowcharts of disassembling the electronic module of FIG. 2 from the casing.
Figure 8B:
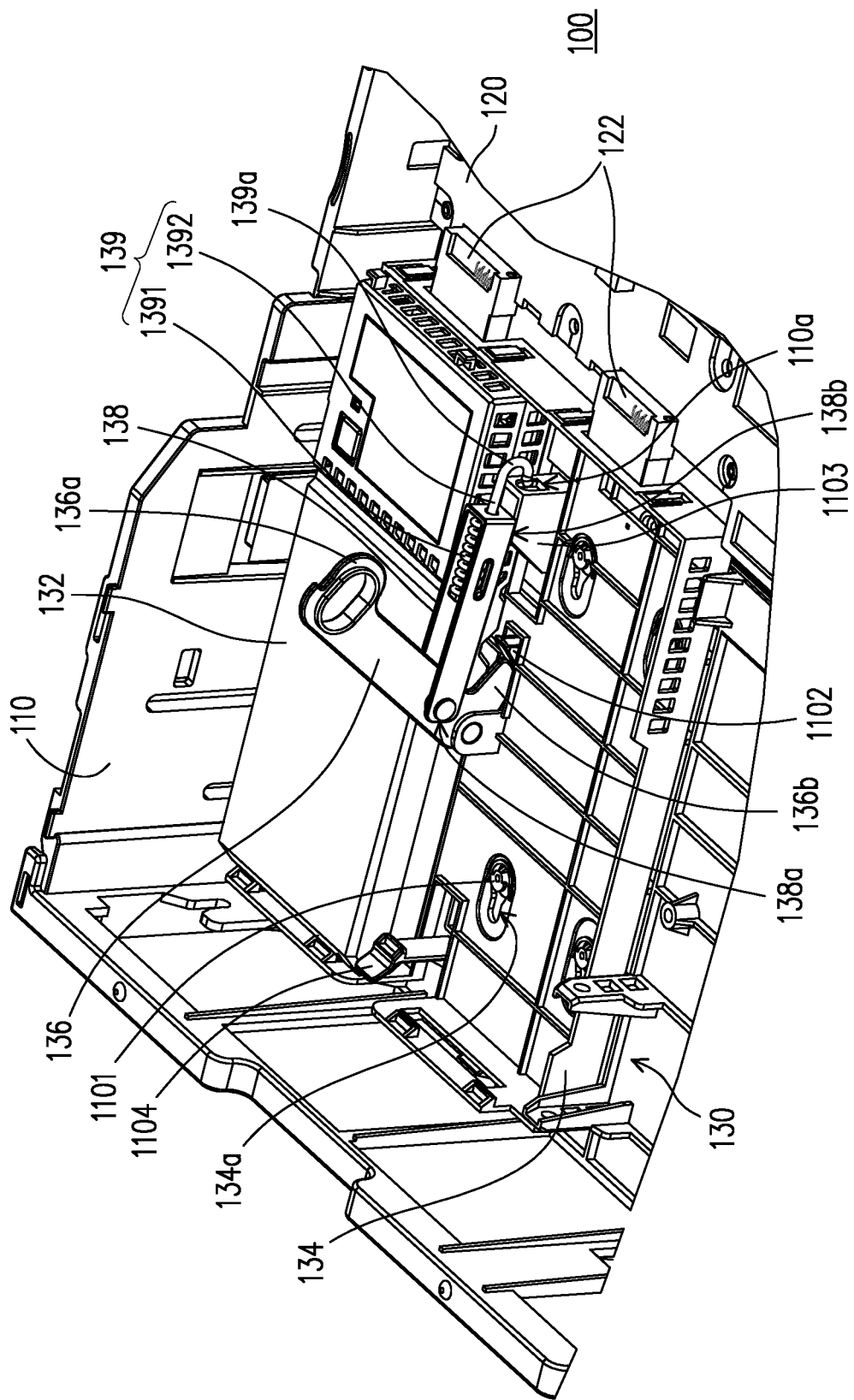
Figure 8C:
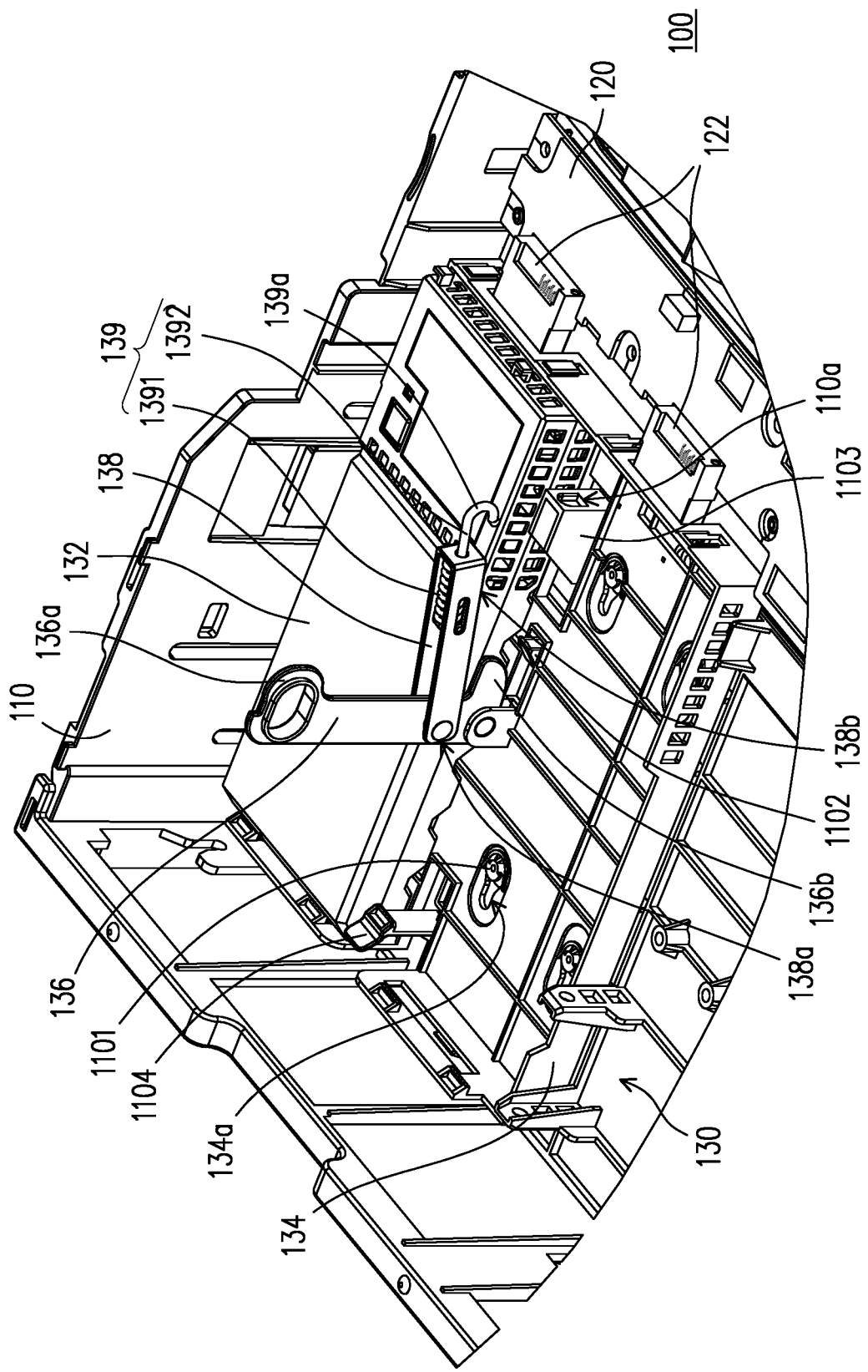

FIG. 8A to FIG. 8C are flowcharts of disassembling the electronic module of FIG. 2 from the casing. Under the state that the hook portion 139*a* is hooked to the hook groove 110*a* and the electronic component 132 is plugged to the electronic assembly 120, when the electronic module 130 is to be disassembled, the user may toggle the buckling component 1104 to separate the buckling portion 136*a*1 of the rotation component 136 from the buckling component 1104 of the casing 110, and then pull the holding portion 136*a* of the rotation component 136 to rotate the rotation component 136 in the first rotation direction R1 (the first rotation direction R1 as shown in FIG. 7A) to reach a state shown in FIG. 8A, for more detail, the rotation component 136 is moved from the third state to the second state. At this moment, the distance between the pivot end 138*a* of the connection component 138 and the hook portion 139*a* of the elastic assembly 139 is gradually reduced, so that the amount of compression of the elastic component 1391 is gradually reduced. Then, when the rotation component 136 is continuously rotated in the first rotation direction R1 to the first state shown in FIG. 8B, the hook portion 139*a* is moved out of the hook groove 110*a* along with the movement of the connection component 138.

While the rotation component 136 is rotated in the first rotation direction R1 to the first state as described above to move the hook portion 139*a* out of the hook groove 110*a*, the abutting portion 136*b* of the rotation component 136 pushes against the first guide portion 1102 to a predetermined position, and the rotation component 136 drives the connection component 138 and the elastic assembly 139 to move, so that the hook portion 139*a* of the elastic assembly 139 moves in a direction opposite to the hooking direction D2 (the same as the plugging direction D1 indicated in FIG. 7A) to make the hook portion 139*a* to be separated from the hook groove 110*a* of the second guide portion 1103. Meanwhile, the electronic module 130 is driven to move in a direction away from the plugging direction D1 (the same as the hooking direction D2 indicated in FIG. 7A) to move away from the electronic assembly 120, at this moment, the electrical component 132 is separated from the connector 122.

Figure 10:
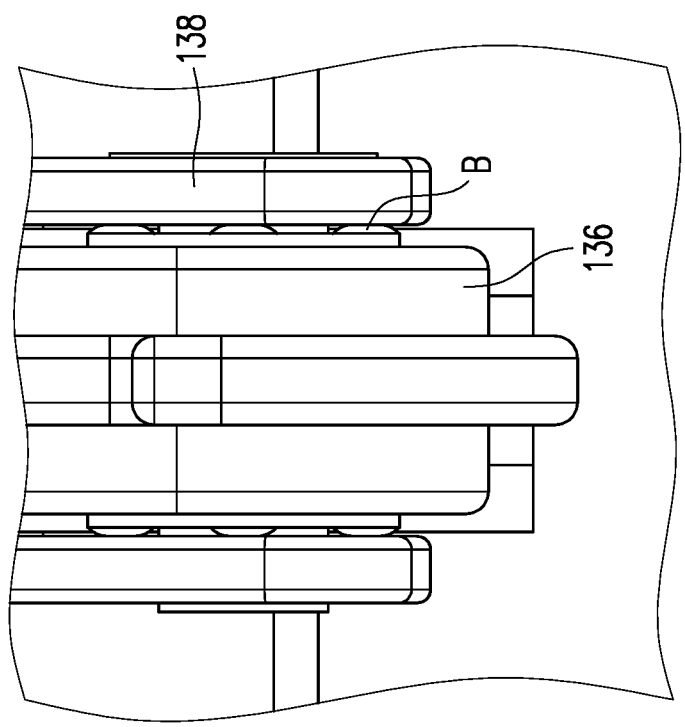
FIG. 10 is a partial enlarged view of the electronic module of FIG. 4.
Figure 9:
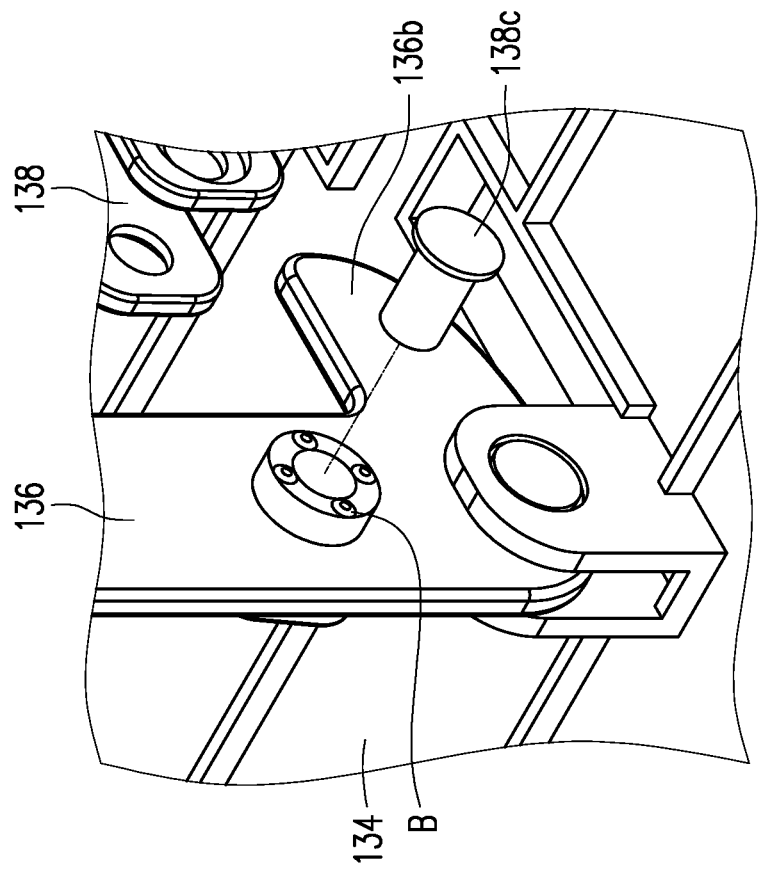
FIG. 9 is a partial exploded view of the electronic module of FIG. 4.

FIG. 9 is a partial exploded view of the electronic module of FIG. 4. FIG. 10 is a partial enlarged view of the electronic module of FIG. 4. Referring to FIG. 9 and FIG. 10, the rotation component 136 of the embodiment is configured with a plurality of bumps B, and the bumps B contact the connection component 138 to produce friction. Thereby, when the rotation component 136 is rotated in the rotation direction R2 (the rotation direction R2 shown in FIG. 7B) from the first state shown in FIG. 8B to the state shown in FIG. 8C, the connection component 138 is lifted through the friction along with the operation of the rotation component 136, so that the hook portion 139*a* is away from the hook groove 110*a*. The user may then lift the electronic module 130 through the rotation component 136.

Figure 11:
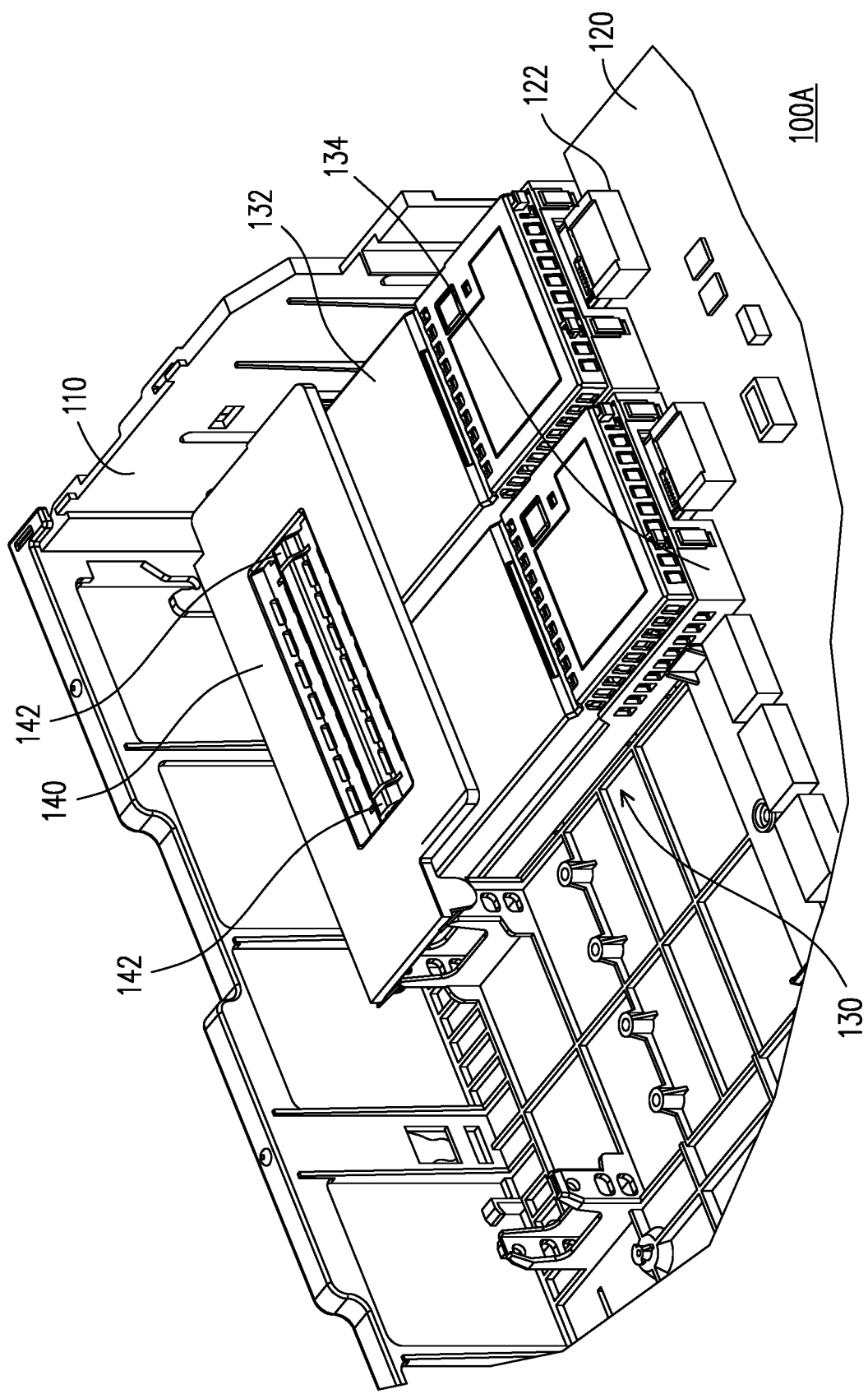
FIG. 11 is a three-dimensional view of an electronic apparatus according to another embodiment of the disclosure.
Figure 12:
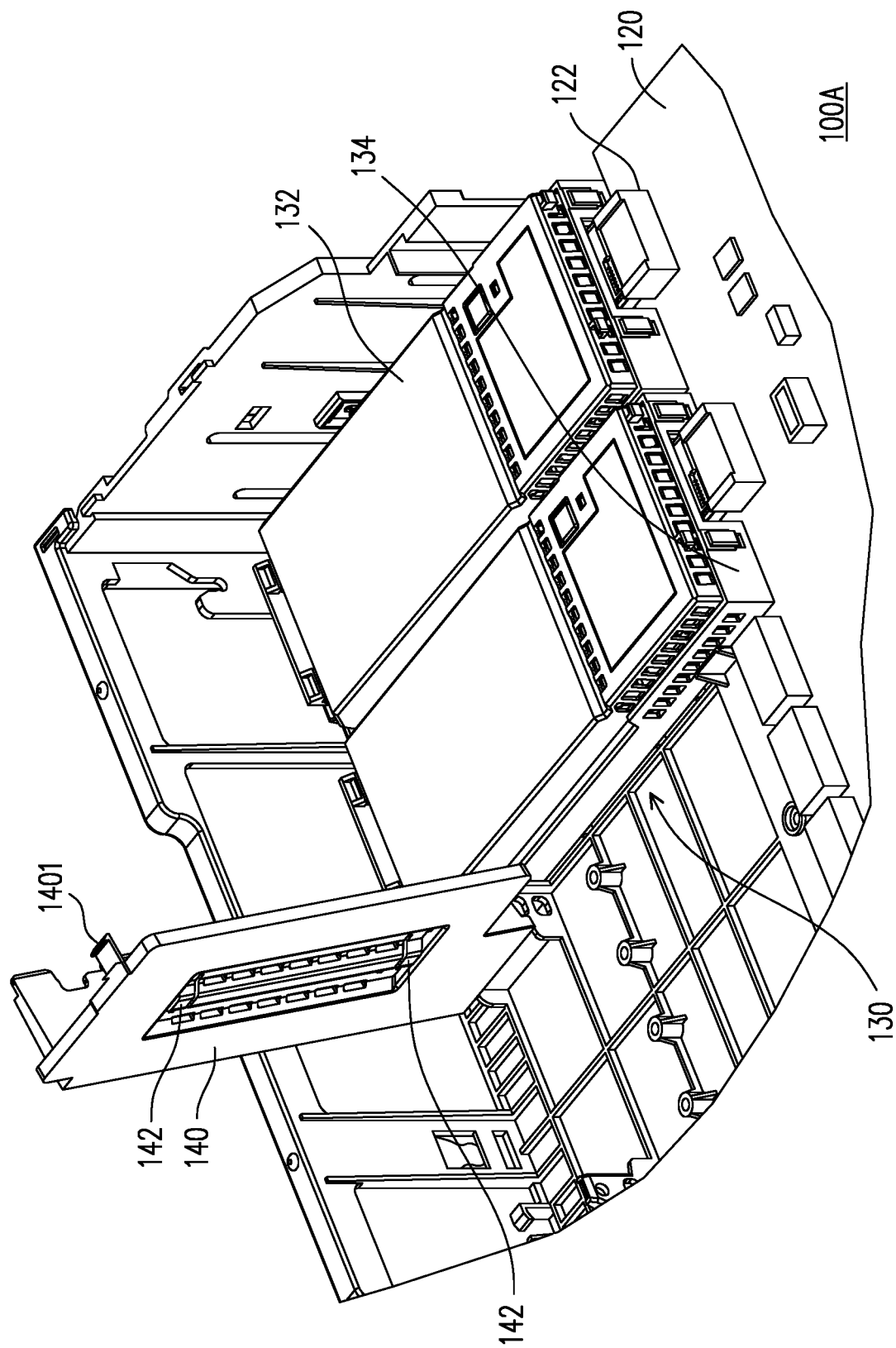
FIG. 12 shows opening of a cover body of FIG. 11.

FIG. 11 is a three-dimensional view of an electronic apparatus according to another embodiment of the disclosure. FIG. 12 shows opening of a cover body of FIG. 11. A main difference between an electronic apparatus 100A shown in FIG. 11 and FIG. 12 and the electronic apparatus 100 of the aforementioned embodiment is that the electronic apparatus 100A includes a cover body 140, where the cover body 140 is pivotally connected to the casing 110 and is adapted to cover the electronic module 130 as shown in FIG. 11, and is adapted to be opened as shown in FIG. 12. The electronic apparatus 100A may include the rotation component 136, the connection component 138, and the elastic assembly 139 of the aforementioned embodiment. However, in order to make the drawing clearer, these components are not shown in the drawing of the electronic apparatus 100A.

Figure 14:
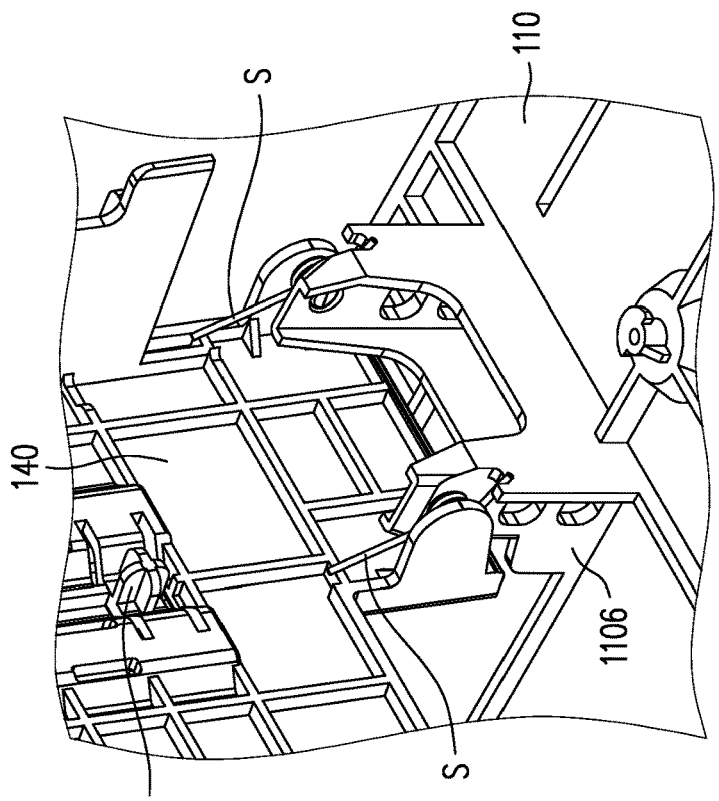
FIG. 14 is a partial three-dimensional view of the electronic apparatus of FIG. 11.
Figure 13:
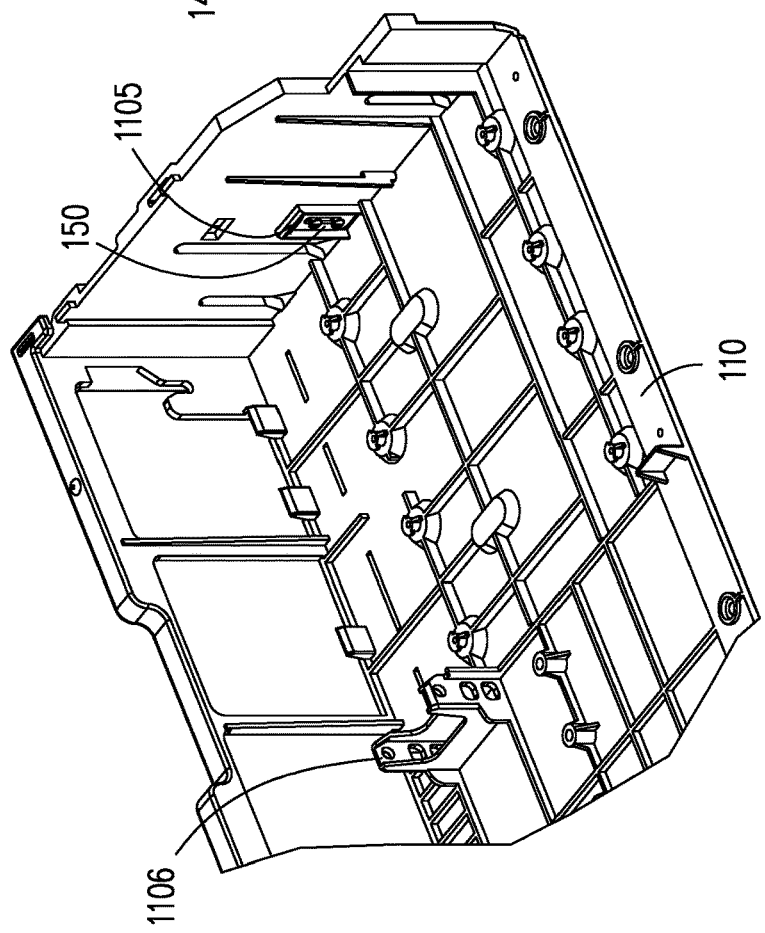
FIG. 13 is a three-dimensional view of a part of components of the electronic apparatus of FIG. 11.

FIG. 13 is a three-dimensional view of a part of components of the electronic apparatus of FIG. 11. FIG. 14 is a partial three-dimensional view of the electronic apparatus of FIG. 11. Referring to FIG. 13 and FIG. 14, the casing 110 of the embodiment is configured with a first coupling portion 1105 and a pivot portion 1106. The pivot portion 1106 is connected pivotally to the cover body 140, and a torsion spring S is provided between the pivot portion 1106 and the cover body 140 for providing a torsion force to assist the opening of the cover body 140. The first coupling portion 1105 is used for buckling with a second coupling portion 1401 (indicated in FIG. 12) of the cover body 140 to resist the elastic force of the torsion spring S to fix the cover body 140 to the state shown in FIG. 11.

Figure 16:
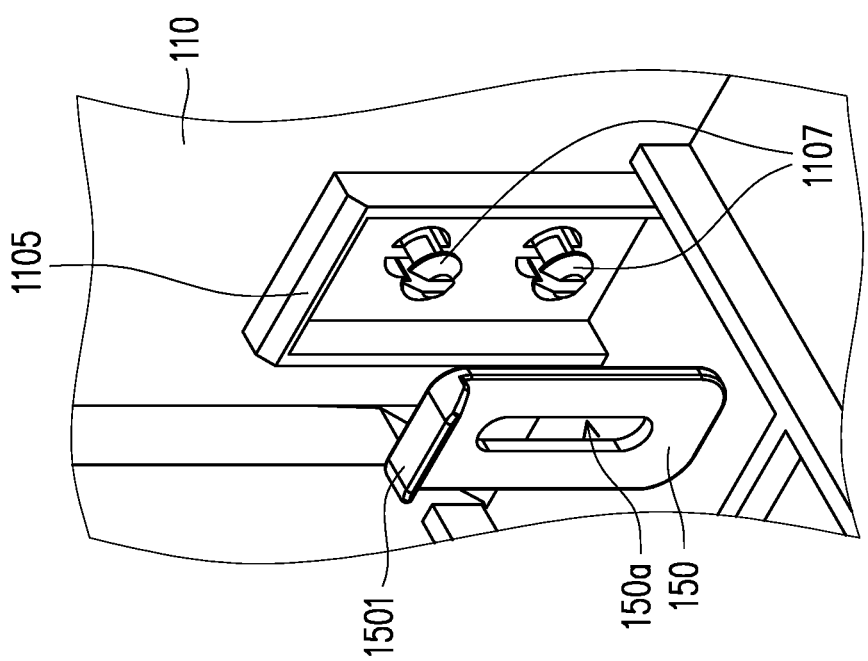
FIG. 16 is an exploded view of the electronic apparatus of FIG. 15.
Figure 15:
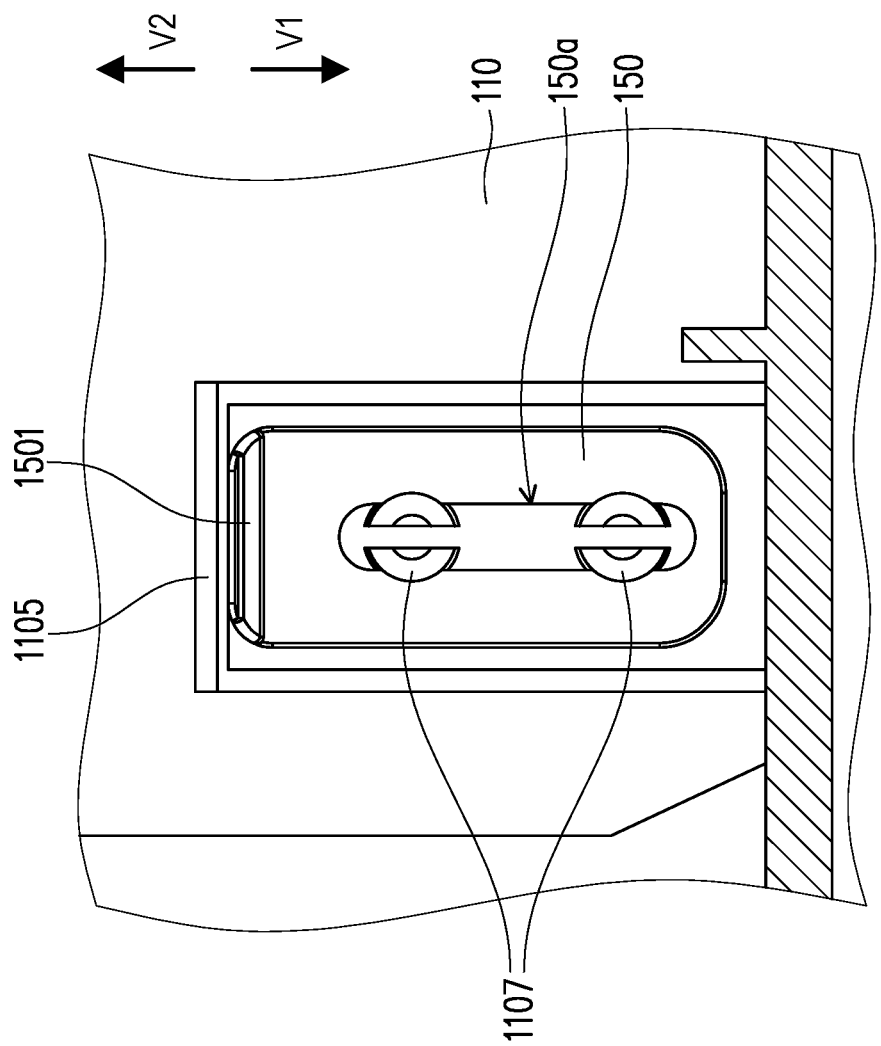
FIG. 15 is a partial enlarged view of the electronic apparatus of FIG. 13.

FIG. 15 is a partial enlarged view of the electronic apparatus of FIG. 13. FIG. 16 is an exploded view of the electronic apparatus of FIG. 15. Referring to FIG. 15 and FIG. 16, the electronic apparatus 100A (indicated in FIG. 11) includes a sliding component 150. The sliding component 150 is slidably disposed on the casing 110 along a first direction V1 and is adjacent to the first coupling portion 1105, and the sliding component 150 is configured with a guide portion 1501. To be specific, the casing 110 is configured with two tenons 1107, and the sliding component 150 is configured with a slot 150*a* and is slidably disposed on the two tenons 1107 through the slot 150*a*. In other embodiments, the sliding component 150 may be slidably disposed on the casing 110 in other ways, which is not limited by the disclosure.

Figure 17B:
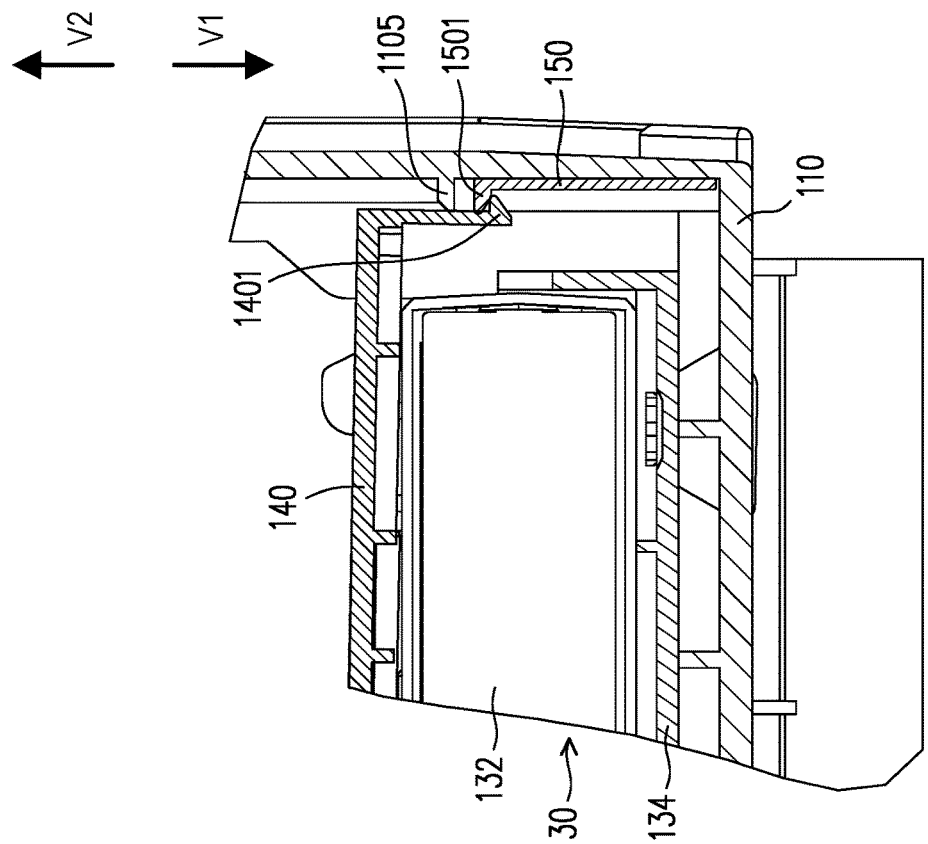
FIG. 17A to FIG. 17D are flowcharts of an operation of a sliding component of FIG. 15.
Figure 17A:
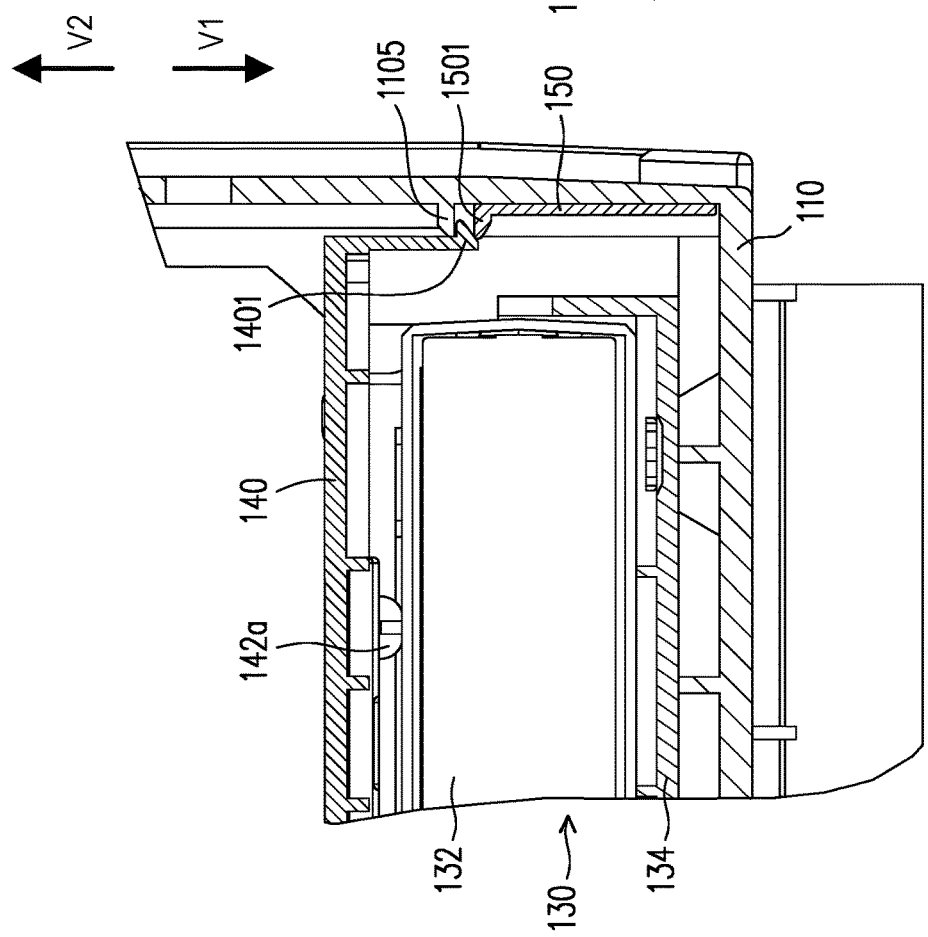
Figure 17D:
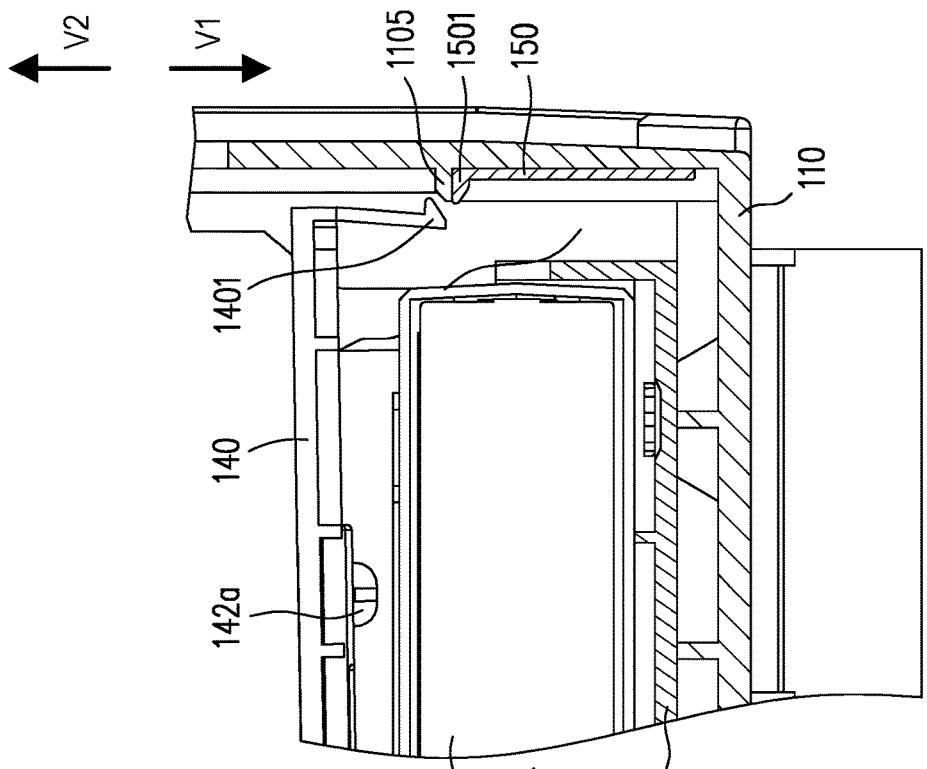
Figure 17C:
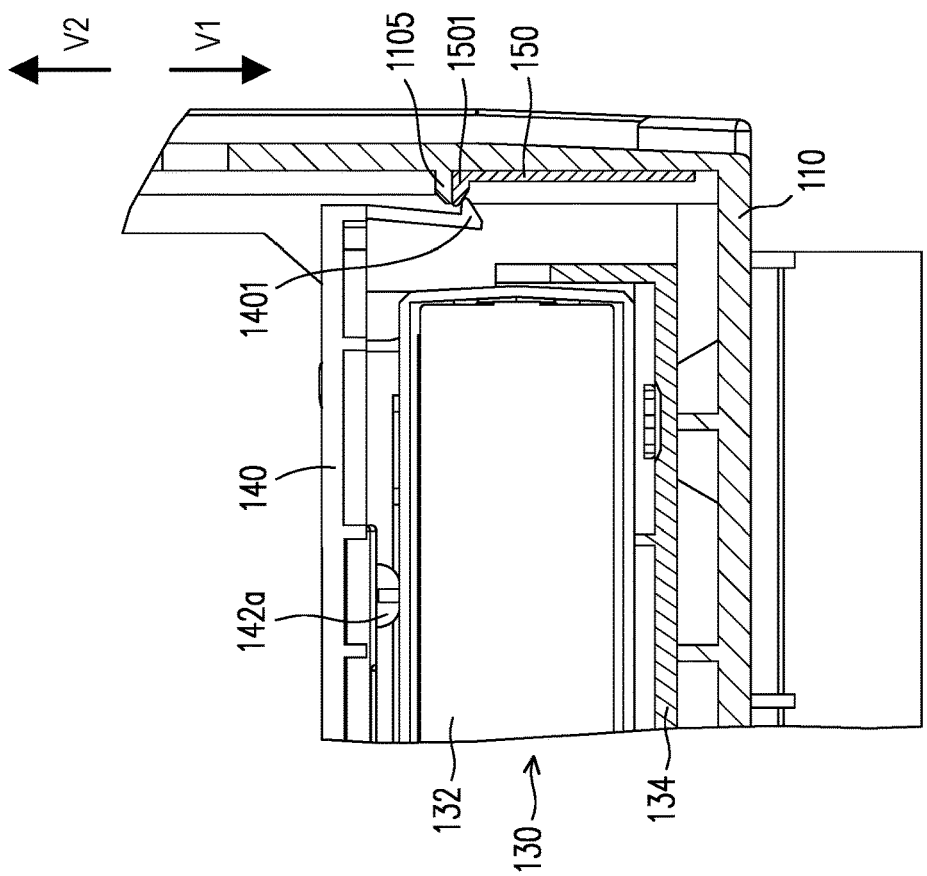

FIG. 17A to FIG. 17D are flowcharts of an operation of the sliding component of FIG. 15. When the cover body 140 covers the electronic module 132 as shown in FIG. 17A, the first coupling portion 1105 and the second coupling portion 1401 are buckled to position the cover body 140, and the second coupling portion 1401 is located between the first coupling portion 1105 and the guide portion 1501. The cover body 140 covering the electronic module 132 is adapted to receive a force (such as the force of pressing down the cover body 140 exerted by the user) so that the second coupling portion 1401 passes over the guide portion 1501 along the first direction V1 as shown in FIG. 17B, and drives the sliding component 150 to abut with the first coupling portion 1105 in a second direction V2 that is opposite to the first direction V1 as shown in FIG. 17C. Then, as shown in FIG. 17D, the second coupling portion 1401 sequentially passes over the guide portion 1501 and the first coupling portion 1105 along the second direction V2 through an upward resilience of the cover body 140 and guidance of the guide portion 1501, so that the cover body 140 is released by the first coupling portion 1105 and opened. In this way, positioning and release of the cover body 140 are achieved through a simple structural design.

Furthermore, the first direction V1 may be a direction of gravity. Therefore, after the second coupling portion 1401 passes over the guide portion 1501 along the second direction V2 as shown in FIG. 17D, the sliding component 150 is reset downward along the first direction V1 through gravity. In other embodiments, the sliding component 150 may be reset along the first direction V1 by other suitable means, which is not limited by the disclosure. For example, an elastic component may be added between the sliding component 150 and the casing 110, and the sliding component 150 may be reset along the first direction V1 through an elastic force of the elastic component.

Figure 18:
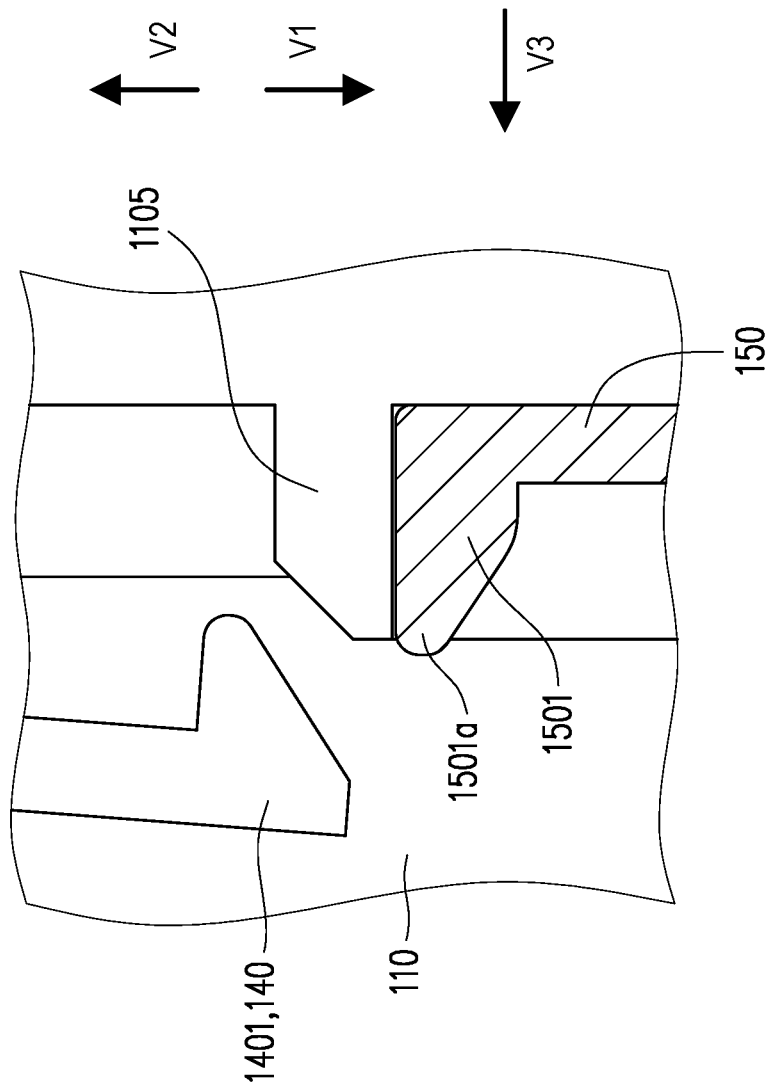
FIG. 18 is a partial enlarged view of the electronic apparatus of FIG. 17D.

FIG. 18 is a partial enlarged view of the electronic apparatus of FIG. 17D. As shown in FIG. 18, in a third direction V3 perpendicular to the first direction V1, a length of the guide portion 1501 is greater than a length of the first coupling portion 1105, so that an end 1501*a* of the guide portion 1501 protrudes out relative to the first coupling portion 1105. Therefore, a situation that the second coupling portion 1401 is blocked by the first coupling portion 1105 after passing over the guide portion 1501 along the second direction V2 and is unable to pass over the first coupling portion 1105 along the second direction V2 is avoided.

Figure 19:
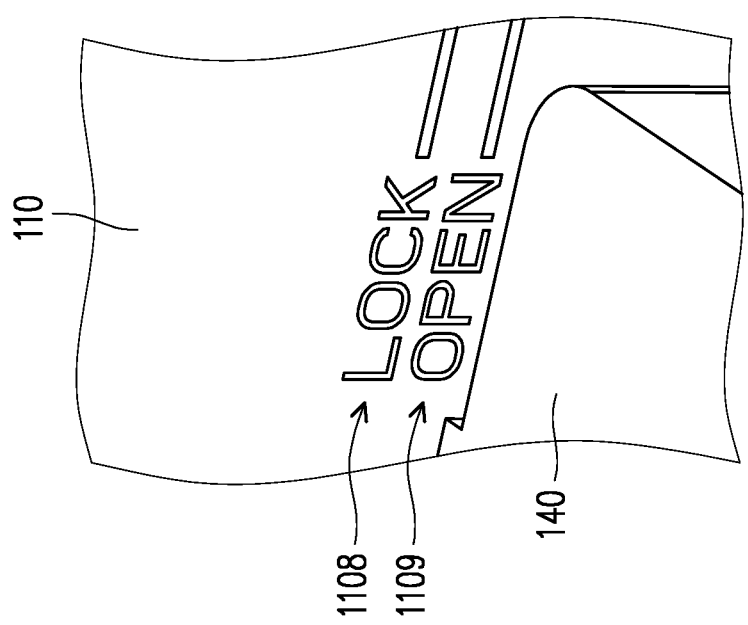
FIG. 19 is a partial enlarged view of the electronic apparatus of FIG. 11.

FIG. 19 is a partial enlarged view of the electronic apparatus of FIG. 11. The casing 110 may be configured with marks 1108 and 1109 adjacent to the first coupling portion 1105 (indicated in FIG. 13) as shown in FIG. 19, which respectively correspond to a height of the cover body 140 in a buckling state shown in FIG. 17A and a height of the cover body 140 in a pre-unlocking state shown in FIG. 17B, which allows the user to easily understand the operation mode of the cover body 140.

Figure 20:
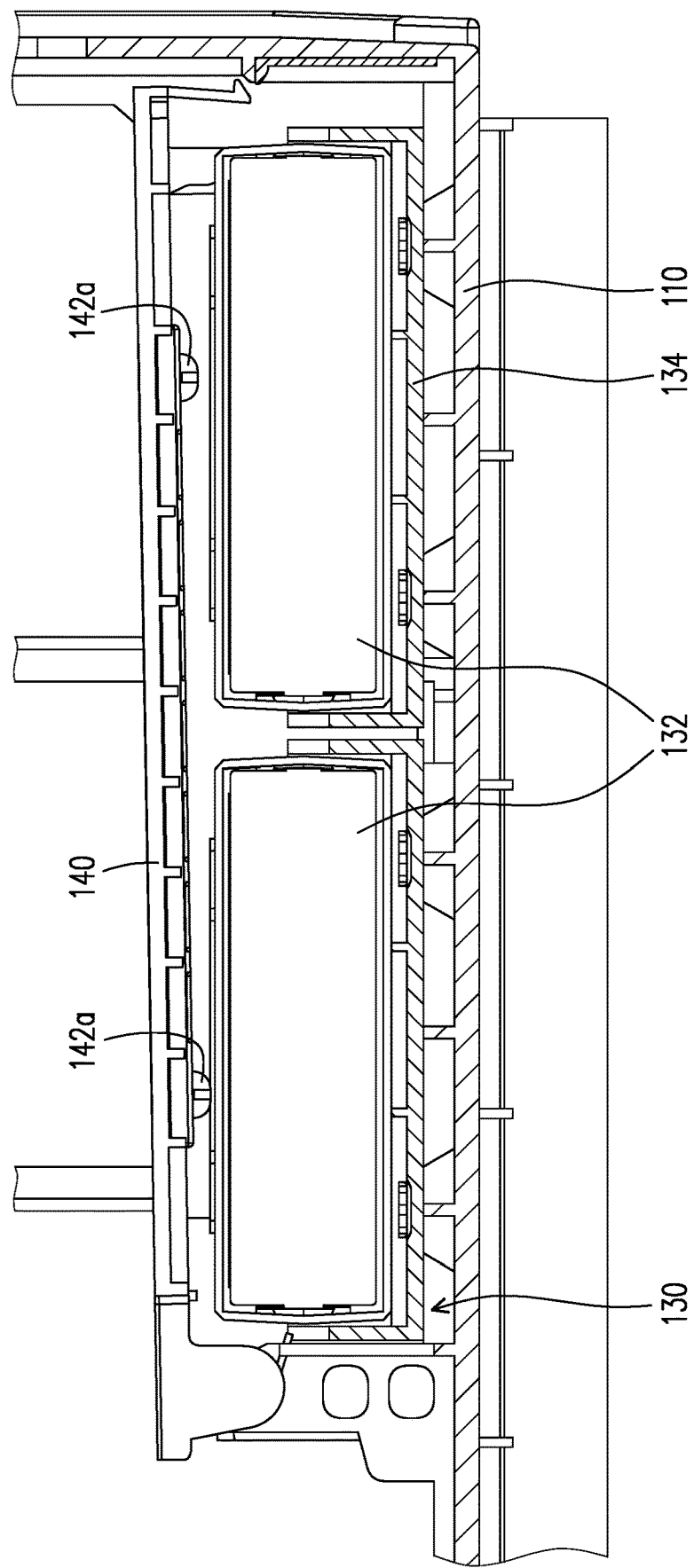
FIG. 20 is a cross-sectional view of the electronic apparatus of FIG. 11.

FIG. 20 is a cross-sectional view of the electronic apparatus of FIG. 11. Referring to FIG. 11, FIG. 14 and FIG. 20, the cover body 140 of the embodiment is configured with at least one elastic arm 142 (two are shown in FIG. 11). When the cover body 140 covers the electronic module 130, the elastic arm 142 leans against the electronic components 132 of the electronic module 130 through bumps 142*a* on a bottom surface thereof to stably fix the electronic module 130. When the cover body 140 is moved in the first direction V1, the elastic arm 142 abuts against the electronic components 132 of the electronic module 130, and the elastic arm 142 is deformed and provides an elastic potential for the cover body 149 to move in the second direction V2.

What is claimed is:

1. An electronic module, adapted to an electronic apparatus, wherein the electronic apparatus comprises a casing and an electronic assembly, and the electronic assembly is disposed on the casing, the electronic module comprising:
   at least one electronic component;
   a carrier, carrying the at least one electronic component, wherein the carrier is arranged on the casing;
   a rotation component, connected pivotally to the carrier;
   a connection component, pivotally connected to the rotation component; and
   an elastic assembly, disposed on the connection component and configured with a hook portion, wherein the hook portion is adapted to be hooked to the casing, such that the at least one electronic component is plugged to the electronic assembly by the elastic assembly,
   wherein the connection component has a pivot end and a free end opposite to each other, the pivot end is connected pivotally to the rotation component, and the elastic assembly is arranged at the free end, wherein the elastic assembly comprises an elastic component and a hook, one end of the hook is configured with the hook portion and extends from a free end of the connection component, and the elastic component is limited between another end of the hook and the free end of the connection component.

2. The electronic module as claimed in claim 1, wherein the casing is configured with a hook groove, the rotation component is adapted to be rotated toward the hook groove in a first rotation direction to a first state so that the hook portion is aligned with the hook groove, and the rotation component is adapted to be rotated in a second rotation direction opposite to the first rotation direction to a second state so that the hook portion aligned with the hook groove is hooked to the hook groove, wherein when the hook portion is hooked to the hook groove and the rotation component is rotated to a third state in the second rotation direction, the electronic module is moved to the electronic assembly through the elastic assembly so that the at least one electronic component is plugged to the electronic assembly, and an elastic force of the elastic assembly prevents the at least one electronic component from being separated from the electronic assembly.

3. The electronic module as claimed in claim 2, wherein when the hook portion is hooked to the hook groove and the rotation component is rotated to the third state in the second rotation direction, the electronic module is moved by a first distance along a plugging direction so that the at least one electronic component is plugged to the electronic assembly, and the pivot end is moved by a second distance relative to the carrier in a direction opposite to the plugging direction, wherein the first distance is equal to the second distance.

4. The electronic module as claimed in claim 2, wherein the casing is configured with a buckling component, and when the rotation component is in the third state, the buckling component positions the rotation component.

5. The electronic module as claimed in claim 2, wherein the casing is configured with a first guide portion, and when the rotation component is rotated in the first rotation direction to the first state to move the hook portion out of the hook groove, the rotation component is pushed against the first guide portion to drive the electronic module to move in a direction away from the electronic assembly.

6. The electronic module as claimed in claim 1, wherein a pivot axial direction of the connection component and the rotation component is parallel to a pivot axial direction of the rotation component and the carrier.

7. An electronic apparatus, comprising:
a casing;
an electronic assembly, disposed on the casing;
an electronic module, comprising:
  at least one electronic component;
  a carrier, carrying the at least one electronic component, wherein the carrier is arranged on the casing;
  a rotation component, connected pivotally to the carrier;
  a connection component, connected pivotally to the rotation component; and
  an elastic assembly, disposed on the connection component and configured with a hook portion, wherein the hook portion is hooked to the casing, such that the at least one electronic component is plugged to the electronic assembly by the elastic assembly,
  wherein the connection component has a pivot end and a free end opposite to each other, the pivot end is connected pivotally to the rotation component, and the elastic assembly is arranged at the free end, wherein the elastic assembly comprises an elastic component and a hook, one end of the hook is configured with the hook portion and extends from a free end of the connection component, and the elastic component is limited between another end of the hook and the free end of the connection component.

8. The electronic apparatus as claimed in claim 7, wherein the casing is configured with a hook groove, the rotation component is adapted to be rotated toward the hook groove in a first rotation direction to a first state so that the hook portion is aligned with the hook groove, and the rotation component is adapted to be rotated in a second rotation direction opposite to the first rotation direction to a second state so that the hook portion aligned with the hook groove is hooked to the hook groove, wherein when the hook portion is hooked to the hook groove and the rotation component is rotated to a third state in the second rotation direction, the electronic module is moved to the electronic assembly through the elastic assembly so that the at least one electronic component is plugged to the electronic assembly.

9. The electronic apparatus as claimed in claim 8, wherein when the hook portion is hooked to the hook groove and the rotation component is rotated to the third state in the second rotation direction, the electronic module is moved by a first distance along a plugging direction so that the at least one electronic component is plugged to the electronic assembly, and the pivot end is moved by a second distance relative to the carrier in a direction opposite to the plugging direction, wherein the first distance is equal to the second distance.

10. The electronic apparatus as claimed in claim 8, wherein the casing is configured with a buckling component, and when the rotation component is in the third state, the buckling component positions the rotation component.

11. The electronic apparatus as claimed in claim 8, wherein the casing is configured with a first guide portion, and when the rotation component is rotated in the first rotation direction to the first state to move the hook portion out of the hook groove, the rotation component is pushed against the first guide portion to drive the electronic module to move in a direction away from the electronic assembly.

12. The electronic apparatus as claimed in claim 7, wherein a pivot axial direction of the connection component and the rotation component is parallel to a pivot axial direction of the rotation component and the carrier.

13. The electronic apparatus as claimed in claim 7, wherein the casing is configured with a first coupling portion, and the electronic apparatus comprises:
  a cover body, pivotally connected to the casing and adapted to cover the electronic module, wherein the cover body is configured with a second coupling portion;
  wherein when the cover body covers the electronic module, the first coupling portion and the second coupling portion are buckled to position the cover body.

14. The electronic apparatus as claimed in claim 13, wherein the casing comprises a sliding component slidably disposed on the casing and adjacent to the first coupling portion, and when the cover body covers the electronic module, the sliding component and the first coupling portion of the casing position the second coupling portion of the cover body.

15. The electronic apparatus as claimed in claim 14, wherein the sliding component is configured with a guide portion, and when the cover body covers the electronic module, the second coupling portion of the cover body is positioned between the guide portion of the sliding component and the first coupling portion of the casing.

16. The electronic apparatus as claimed in claim 15, wherein a length of the guide portion of the sliding component in one direction is greater than a length of the first coupling portion.

17. The electronic apparatus as claimed in claim 13, wherein the cover body is configured with at least one elastic arm, and when the cover body covers the electronic module, the at least one elastic arm leans against the electronic module.

* * * * *